US012593431B2

(12) United States Patent
Lee et al.

(10) Patent No.: US 12,593,431 B2
(45) Date of Patent: Mar. 31, 2026

(54) SEMICONDUCTOR MEMORY DEVICE OF 2T-1C STRUCTURE AND METHOD OF FABRICATING THE SAME

(71) Applicant: Samsung Electronics Co., Ltd., Suwon-si (KR)

(72) Inventors: Kyunghwan Lee, Seoul (KR); Yongseok Kim, Suwon-si (KR); Hyuncheol Kim, Seoul (KR); Jongman Park, Hwaseong-si (KR); Dongsoo Woo, Seoul (KR); Minjun Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 370 days.

(21) Appl. No.: 17/881,747

(22) Filed: Aug. 5, 2022

(65) Prior Publication Data

US 2023/0101700 A1      Mar. 30, 2023

(30) Foreign Application Priority Data

Sep. 27, 2021      (KR) ........................ 10-2021-0127469

(51) Int. Cl.
*H10B 12/00*      (2023.01)
(52) U.S. Cl.
CPC ................................... *H10B 12/00* (2023.02)
(58) Field of Classification Search
CPC ................................ H10B 12/01; H10B 12/00
See application file for complete search history.

(56) References Cited

U.S. PATENT DOCUMENTS

| | | | |
|---|---|---|---|
| 10,020,311 | B1 | 7/2018 | Li et al. |
| 10,032,777 | B1 | 7/2018 | Chen et al. |
| 10,157,926 | B2 | 12/2018 | Yang et al. |
| 10,529,720 | B2 | 1/2020 | Sills et al. |
| 10,636,479 | B2 | 4/2020 | Ikeda et al. |
| 10,748,987 | B2 | 8/2020 | Ramaswamy |
| 10,847,516 | B2 | 11/2020 | Mathew et al. |
| 10,854,611 | B2 | 12/2020 | Mathew et al. |

(Continued)

FOREIGN PATENT DOCUMENTS

| | | |
|---|---|---|
| KR | 10-2015-0142762 A | 12/2015 |
| KR | 10-2018-0130581 A | 12/2018 |

(Continued)

*Primary Examiner* — Edward Chin
(74) *Attorney, Agent, or Firm* — Harness, Dickey & Pierce, P.L.C.

(57) ABSTRACT

A semiconductor memory device may include first and second bit lines spaced apart from each other, an interlayer insulating layer covering the first and second bit lines and including a groove extending to cross both of the first and second bit lines, a first channel pattern connected to the first bit line and in contact with an inner side surface of the groove and covering a top surface of the interlayer insulating layer, a second channel pattern connected to the second bit line and in contact with an opposite inner side surface of the groove and covering the top surface of the interlayer insulating layer, a word line in the groove, first and second electrodes on the interlayer insulating layer and in contact with the first and second channel patterns, respectively, and a dielectric layer between the first and second electrodes.

20 Claims, 65 Drawing Sheets

100(MC)

(56)     References Cited

U.S. PATENT DOCUMENTS

| | | | |
|---|---|---|---|
| 11,037,622 B2 | 6/2021 | Atsumi et al. | |
| 2008/0048226 A1* | 2/2008 | Heo | H01L 28/57 |
| | | | 257/295 |
| 2018/0197864 A1 | 7/2018 | Sills | |
| 2019/0088652 A1* | 3/2019 | Yang | H10D 1/716 |
| 2019/0326292 A1* | 10/2019 | Mathew | H10B 12/395 |
| 2020/0365591 A1 | 11/2020 | Kunitake et al. | |
| 2021/0287746 A1 | 9/2021 | Chen et al. | |

FOREIGN PATENT DOCUMENTS

| | | | |
|---|---|---|---|
| TW | 201935478 A | 9/2019 | |
| WO | WO-2018044456 A1 * | 3/2018 | G11C 11/403 |

* cited by examiner

GOR

BL2

CH2

BL1

101(MC_L)

TE ⎫
     ⎬ CAP
BE ⎭

CH1

BL2

BL1

BLC1

BLC2

WL

CH2

X3
X2
X1

SEMICONDUCTOR MEMORY DEVICE OF 2T-1C STRUCTURE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2021-0127469, filed on Sep. 27, 2021, in the Korean Intellectual Property Office, the entire contents of which are hereby incorporated by reference.

BACKGROUND

The present disclosure relates to a semiconductor memory device and/or a method of fabricating the same, and in particular, to a semiconductor memory device of 2T-1C structure and/or a method of fabricating the same.

Due to their small-sized, multifunctional, and/or low-cost characteristics, semiconductor devices are being esteemed as essential elements in the electronics industry. With the advancement of the electronic industry, there is an increasing demand for a semiconductor device with higher integration density. To increase the integration density of the semiconductor device, it may be necessary to reduce linewidths of patterns constituting the semiconductor device. However, novel and expensive exposure technologies may be needed to reduce the linewidths of the patterns, and thus, it can become difficult to increase the integration density of the semiconductor device. Accordingly, a variety of studies on innovative technology for increasing integration density of a semiconductor device are being actively conducted.

SUMMARY

An embodiment of inventive concepts provides a semiconductor memory device with improved reliability.

An embodiment of inventive concepts provides a method of simplifying a process of fabricating a semiconductor memory device.

According to an embodiment of inventive concepts, a semiconductor memory device may include a first bit line and a second bit line extending in a first direction and spaced apart from each other in a second direction; an interlayer insulating layer covering the first bit line and the second bit line, the interlayer insulating layer including a groove, the groove extending in the second direction and crossing both of the first bit line and the second bit line; a first channel pattern connected to the first bit line, the first channel pattern in contact with an inner side surface of the groove, and the first channel pattern covering a portion of a top surface of the interlayer insulating layer; a second channel pattern connected to the second bit line, the second channel pattern in contact with an opposite inner side surface of the groove, and the second channel pattern covering an other portion of the top surface of the interlayer insulating layer; a word line in the groove; a first electrode on the interlayer insulating layer and in contact with the first channel pattern; a second electrode on the interlayer insulating layer and in contact with the second channel pattern; and a dielectric layer between the first electrode and the second electrode.

According to an embodiment of inventive concepts, a semiconductor memory device may include a first bit line and a second bit line extending in a first direction and spaced apart from each other in a second direction; a word line extending in the second direction on the first bit line and the second bit line; a capacitor on the word line, the capacitor including a first electrode, a second electrode, and a dielectric layer between the first electrode and the second electrode; a first channel pattern connecting the first bit line to the first electrode, the first channel pattern disposed adjacent to a side surface of the word line; and a second channel pattern connecting the second bit line to the second electrode, the second channel pattern disposed adjacent to an opposite side surface of the word line. The first channel pattern and the second channel pattern each may include a first pattern portion overlapping the word line from below the word line, a second pattern portion adjacent to one of the side surface of the word line or the opposite side surface of the word line, and a third pattern portion extending from the second pattern portion. The third pattern portion may be horizontally offset from the first pattern portion.

According to an embodiment of inventive concepts, a semiconductor memory device may include a first bit line and a second bit line extending in a first direction and spaced apart from each other in a second direction; an interlayer insulating layer covering the first bit line and the second bit line, the interlayer insulating layer including a groove, the groove extending in the second direction and crossing both the first bit line and the second bit line; a first channel pattern connected to the first bit line, the first channel pattern in contact with a first inner side surface of the groove and covering a portion of a top surface of the interlayer insulating layer; a second channel pattern connected to the second bit line, the second channel pattern in contact with a second inner side surface of the groove, and the second channel pattern covering an other portion of the top surface of the interlayer insulating layer; a first bit line contact between the first channel pattern and the first bit line and connecting the first channel pattern and the first bit line to each other; a second bit line contact between the second channel pattern and the second bit line and connecting the second channel pattern and the second bit line to each other; a word line in the groove; a gate insulating layer between the word line and the first channel pattern and between the word line and the second channel pattern; a word line capping layer covering the word line; a first electrode on the interlayer insulating layer and in contact with the first channel pattern; a second electrode on the interlayer insulating layer and in contact with the second channel pattern; and a dielectric layer between the first electrode and the second electrode. The first channel pattern and the second channel pattern may overlap the first bit line and the second bit line, respectively.

According to an embodiment of inventive concepts, a method of fabricating a semiconductor memory device may include forming a first bit line and a second bit line on a substrate, the first bit line and the second bit line extending in a first direction and being spaced apart from each other in a second direction; forming a first interlayer insulating layer covering the first bit line and the second bit line; etching the first interlayer insulating layer, the etching the first interlayer insulating layer forming a trench in the first interlayer insulating layer; forming a first channel pattern and a second channel pattern that partially cover inner side surfaces of the trench and a top surface of the first interlayer insulating layer, the first channel pattern and the second channel pattern being spaced apart from each other; forming a groove in the first interlayer insulating layer, the forming the groove including etching a portion of the first interlayer insulating layer near the trench; forming a gate insulating layer, a word line, and a word line capping layer in the groove and the trench; and forming a first electrode and a second electrode in contact with the first channel pattern and the second channel pattern, respectively.

BRIEF DESCRIPTION OF THE DRAWINGS

FIG. 3 is a circuit diagram illustrating the semiconductor memory device of FIGS. 1A to 1C.

FIGS. 5A to 17A and 19A are plan views sequentially illustrating a process of fabricating a semiconductor memory device having the planar structure of FIG. 1A.

FIGS. 5B to 17B, 18A, 18B, and 19B are sectional views sequentially illustrating a process of fabricating a semiconductor memory device having the sectional structure of FIG. 1B.

FIGS. 5C to 17C and 19C are sectional views sequentially illustrating a process of fabricating a semiconductor memory device having the sectional structure of FIG. 1C.

FIG. 21A to 26A are plan views sequentially illustrating a process of fabricating a semiconductor memory device having the planar structure of FIG. 20A.

FIG. 21B to 26B are sectional views sequentially illustrating a process of fabricating a semiconductor memory device having the sectional structure of FIG. 20B.

DETAILED DESCRIPTION

Example embodiments of inventive concepts will now be described more fully with reference to the accompanying drawings, in which example embodiments are shown.

Figure 1A:
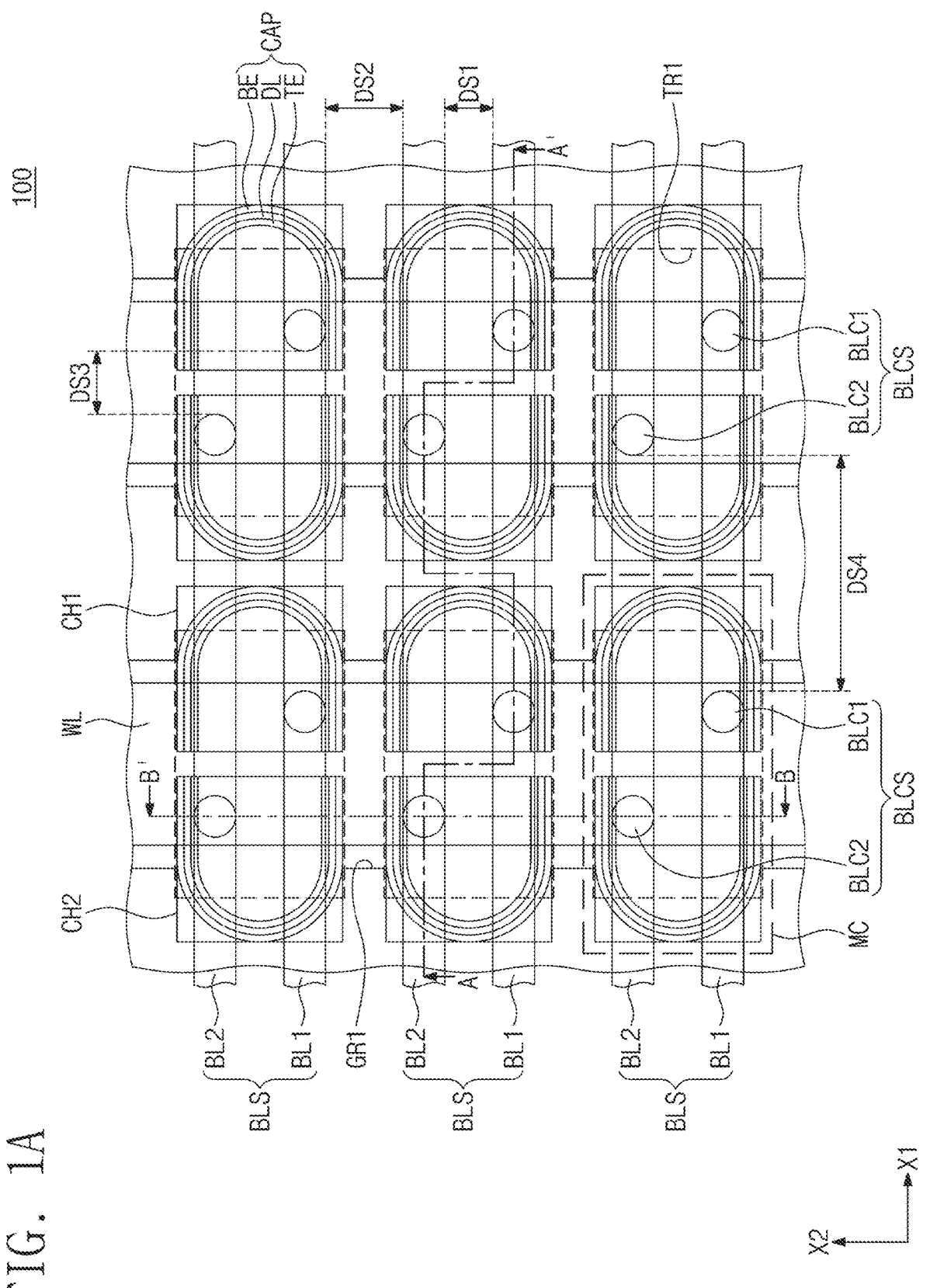
FIG. 1A is a plan view illustrating a semiconductor memory device according to an embodiment of inventive concepts.
Figure 1B:
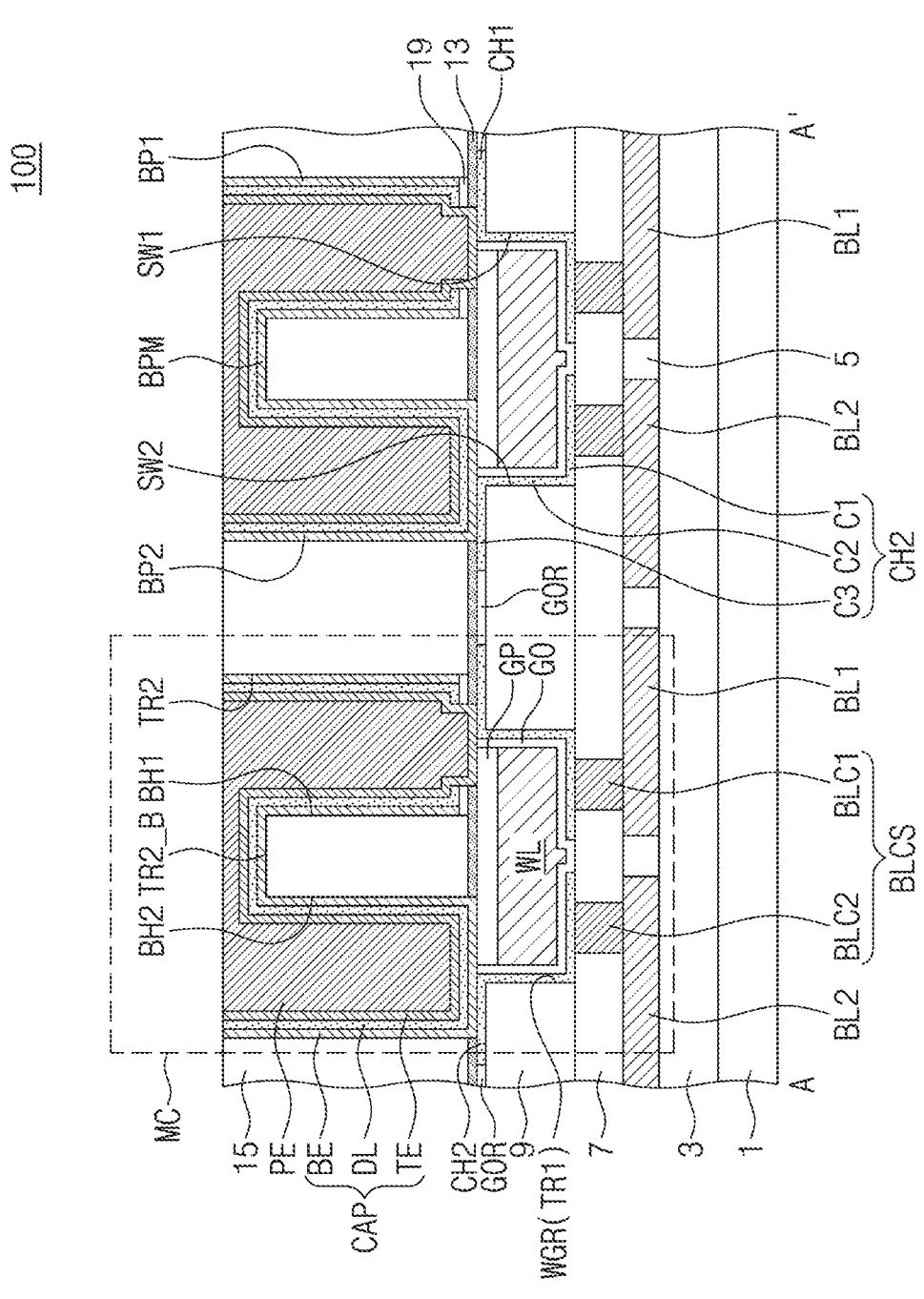
FIG. 1B is a sectional view taken along a line A-A' of FIG. 1A.
Figure 1C:
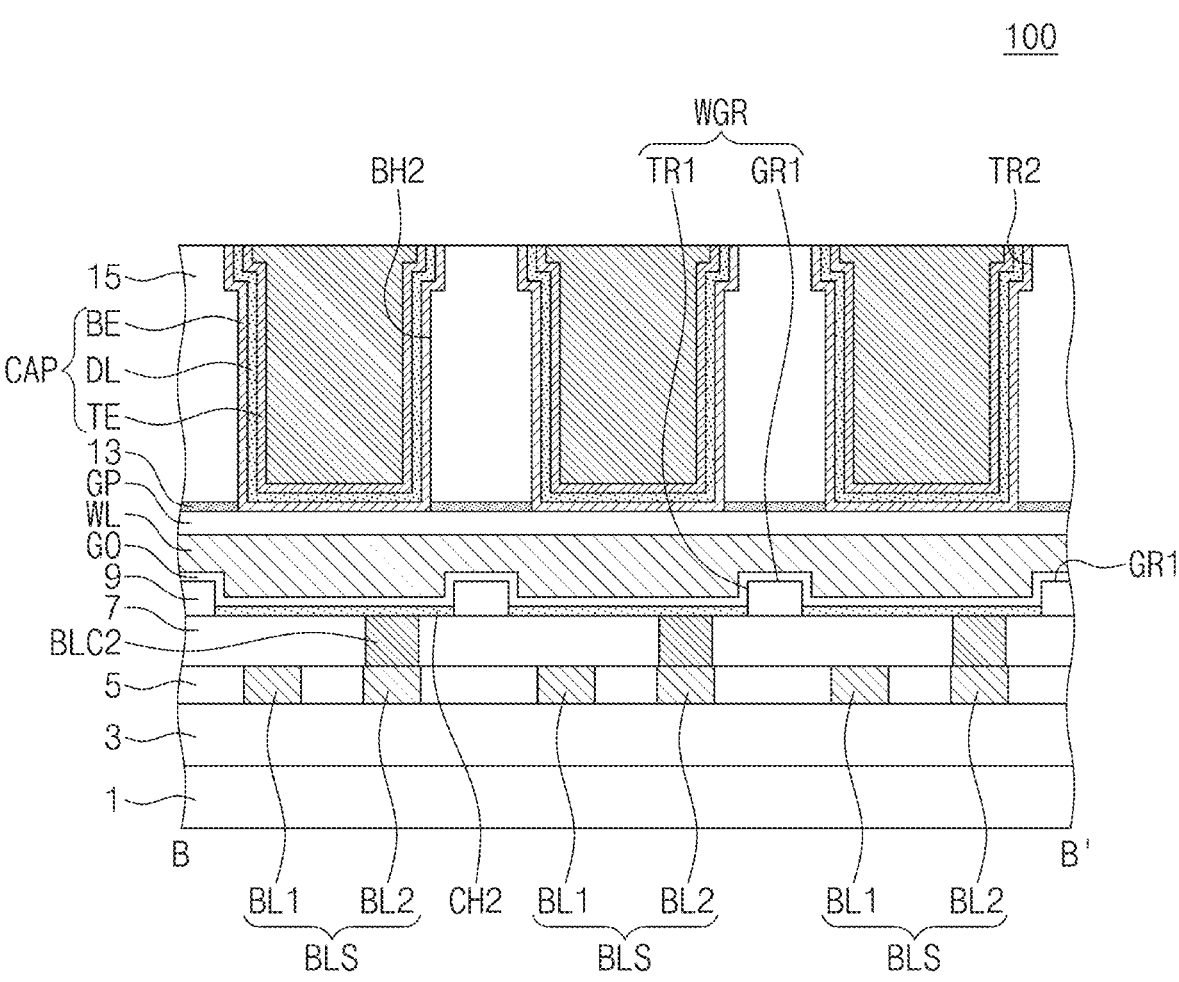
FIG. 1C is a sectional view taken along a line B-B' of FIG. 1A.
Figure 2:
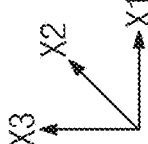
FIG. 2 is a perspective view illustrating a unit memory cell of FIGS. 1A and 1B.
Figure 3:
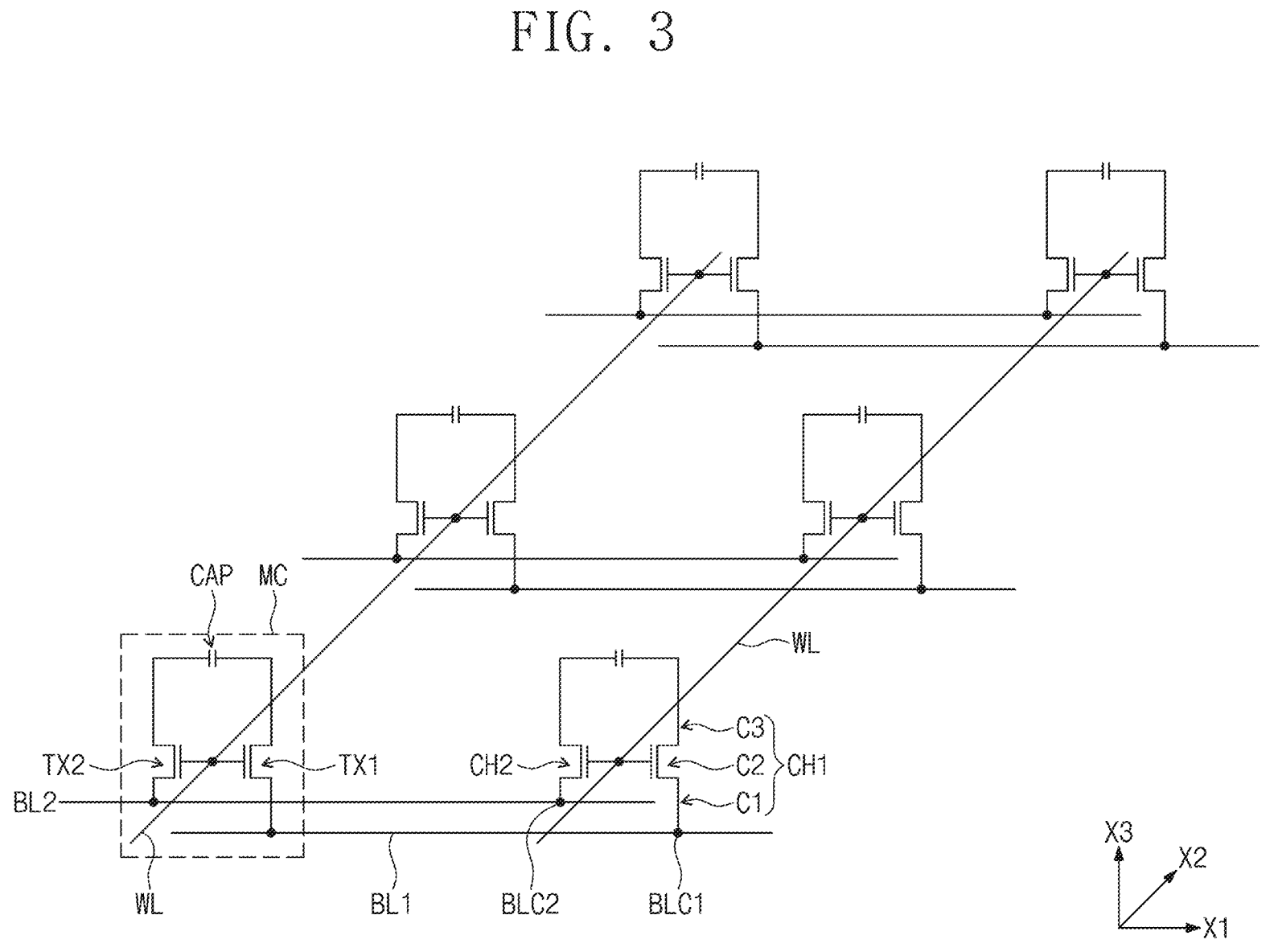

FIG. 1A is a plan view illustrating a semiconductor memory device according to an embodiment of inventive concepts. FIG. 1B is a sectional view taken along a line A-A' of FIG. 1A. FIG. 1C is a sectional view taken along a line B-B' of FIG. 1A. FIG. 2 is a perspective view illustrating a unit memory cell of FIGS. 1A and 1B. FIG. 3 is a circuit diagram illustrating the semiconductor memory device of FIGS. 1A to 1C.

Referring to FIGS. 1A to 1C, a semiconductor memory device 100 according to the present embodiment may include a substrate 1. A first interlayer insulating layer 3 may be disposed on the substrate 1. The substrate 1 may be, for example, a single-crystalline silicon substrate or a silicon-on-insulator (SOI) substrate. The first interlayer insulating layer 3 may be formed of or include at least one of silicon oxide, silicon nitride, or silicon oxynitride and may have a single- or multi-layered structure.

First bit lines BL1 and second bit lines BL2, which extend in a first direction X1, may be disposed on the first interlayer insulating layer 3 and may be alternately arranged in a second direction X2. The first and second bit lines BL1 and BL2, which are alternately arranged, may constitute bit line sets BLS, each of which is composed of an adjacent pair of the first and second bit lines BL1 and BL2. In other words, one first bit line BL1 and one second bit line BL2 adjacent thereto may constitute one bit line set BLS. A first distance DS1 between the pair of the first and second bit lines BL1 and BL2 constituting each bit line set BLS may be smaller than a second distance DS2 between the bit line sets BLS.

The first and second bit lines BL1 and BL2 may be formed of or include at least one of doped polysilicon, a metal silicide, a metal nitride, and/or a metallic material. Here, the metal silicide may be titanium silicide or cobalt silicide. The metal nitride may be titanium nitride, tantalum nitride, or tungsten nitride. The metallic material may be aluminum, copper, tungsten, ruthenium, molybdenum, or iridium. A second interlayer insulating layer 5 may be interposed between the first and second bit lines BL1 and BL2

The first and second bit lines BL1 and BL2 may be covered with a third interlayer insulating layer 7. The third interlayer insulating layer 7 may be formed of or include at least one of silicon oxide, silicon nitride, or silicon oxynitride and may have a single- or multi-layered structure.

First and second bit line contacts BLC1 and BLC2 may be provided to penetrate the third interlayer insulating layer 7 and may be connected to the first and second bit lines BL1 and BL2, respectively. The first and second bit line contacts BLC1 and BLC2 may be formed of or include doped polysilicon, a metal silicide, a metal nitride and/or a metallic layer. On each bit line set BLS, the first and second bit line contacts BLC1 and BLC2 may be arranged in the first direction X1 and in a zigzag shape.

Adjacent ones of the first and second bit line contacts BLC1 and BLC2, which are provided on each bit line set BLS, may constitute bit line contact sets BLCS. Each bit line contact set BLCS may include one first bit line contact BLC1 and one second bit line contact BLC2 adjacent thereto. A third distance DS3 between an adjacent pair of the first and second bit line contacts BLC1 and BLC2 in each bit line contact set BLCS may be smaller than a fourth distance DS4 between adjacent ones of the bit line contact sets BLCS.

A fourth interlayer insulating layer 9 may be disposed on the third interlayer insulating layer 7. The fourth interlayer insulating layer 9 may be formed of or include at least one of silicon oxide, silicon nitride, or silicon oxynitride and may have a single- or multi-layered structure. First trenches TR1 may be formed in the fourth interlayer insulating layer 9. The first trenches TR1 may be two-dimensionally arranged in the first and second directions X1 and X2. Each of the first trenches TR1 may be provided to expose the first and second bit line contacts BLC1 and BLC2 of each bit line contact set BLCS.

A first groove GR1 may be formed between the first trenches TR1, which are adjacent to each other in the second direction X2, and in the fourth interlayer insulating layer 9. The first groove GR1 may connect the first trenches TR1 to each other in the second direction X2. As a result, the first groove GR1 and the first trenches TR1 may be connected to each other in the second direction X2 to form a word line groove WGR of FIG. 1C. A portion of the fourth interlayer insulating layer 9 below the first groove GR1 may be thinner than another portion of the fourth interlayer insulating layer 9 located between the first trenches TR1 in the first direction X1.

First and second channel patterns CH1 and CH2 may be disposed in each of the first trenches TR1. The first trench TR1 may have a first inner side surface SW1 and a second inner side surface SW2, which are opposite to each other. The first channel pattern CH1 may be in contact with the first inner side surface SW1. The second channel pattern CH2 may be in contact with the second inner side surface SW2. The first and second channel patterns CH1 and CH2 may be spaced apart from each other. Each of the first and second channel patterns CH1 and CH2 may include a first pattern portion C1 covering a bottom surface of the first trench TR1, a second pattern portion C2 covering a side surface of the first trench TR1, and a third pattern portion C3 covering a top surface of the fourth interlayer insulating layer 9 outside the first trench TR1. The first pattern portion C1 may be offset from the third pattern portion C3 in the first direction X1. The first and second channel patterns CH1 and CH2 may be provided to have mirror symmetric sections with respect to each other. The first channel pattern CH1 in each of the first trenches TR1 may be in contact with the first bit line contact BLC1. The second channel pattern CH2 in each of the first trenches TR1 may be in contact with the second bit line contact BLC2. Each of the first channel patterns CH1 may overlap a corresponding one of the bit line sets BLS. Each of the second channel patterns CH2 may also overlap a corresponding one of the bit line sets BLS.

The first and second channel patterns CH1 and CH2 may be formed of or include a doped or undoped semiconductor material. For example, the semiconductor material may be one of Si, SiGe, and SiC. Alternatively, the first and second channel patterns CH1 and CH2 may be formed of or include at least one of metal oxide semiconductor materials. The metal oxide semiconductor materials may include, for example, In, Ga, Zn, Sn, and Ba. Alternatively, the metal oxide semiconductor materials may include IGZO, IWZO, ITZO, and BaSnO. In an embodiment, the metal oxide semiconductor materials may be doped with nitrogen. For example, the metal oxide semiconductor materials may include SnO:N, InO:N, GaO:N, ZnO:N, InSnO:N, InGaO: N, InZnON, ZnSnO:N, ZnGaO:N, SnGaO:N, InGaZnO:N, InSnGaO:N, InSnZnO:N, SnZnGaO:N, or InGaZnSnO:N. In an embodiment, the first and second channel patterns CH1 and CH2 may be formed of or include at least one of two-dimensional materials (e.g., $MoS_2$ and $WSe_2$).

The first and second pattern portions C1 and C2 of the first and second channel patterns CH1 and CH2 may be covered with a gate insulating layer GO. The gate insulating layer GO may be formed of or include at least one of silicon oxide and/or metal oxide. The gate insulating layer GO may also cover a top surface of the third interlayer insulating layer 7 between the first and second channel patterns CH1 and CH2. The gate insulating layer GO may also cover the fourth interlayer insulating layer 9 below the first groove GR1. An exposed top surface of the fourth interlayer insulating layer 9, which is located between the first trenches TR1 in the first direction X1, may be covered with a residual gate insulating layer GOR. The residual gate insulating layer GOR may be formed of or include the same material as the gate insulating layer GO.

A word line WL may be disposed in the word line groove WGR. The word line WL may be extending in the second direction X2 and may cross the first and second bit lines BL1 and BL2. In an embodiment, a plurality of the word lines WL may be provided to be spaced apart from each other in the first direction X1. The word line WL may be in contact with the gate insulating layer GO and may be spaced apart from the first and second channel patterns CH1 and CH2. The word line WL may be formed of or include at least one of doped polysilicon, a metal silicide, a metal nitride, and/or a metallic material. Here, the metal silicide may be titanium silicide or cobalt silicide. The metal nitride may be titanium nitride, tantalum nitride, or tungsten nitride. The metallic material may be aluminum, copper, tungsten, ruthenium, molybdenum, or iridium.

The word line WL may have an uneven bottom surface. The word line WL may have the top surface that is lower than a top surface of the fourth interlayer insulating layer 9 and/or top surfaces of the first and second channel patterns CH1 and CH2. A word line capping layer GP may be disposed on the word line WL. The word line capping layer GP may be formed of or include at least one of silicon oxide, silicon nitride, or silicon oxynitride and may have a single- or multi-layered structure. A top surface of the word line capping layer GP may be coplanar with the top surfaces of the first and second channel patterns CH1 and CH2.

An etch stop layer 13 may be disposed on the word line capping layer GP and the first and second channel patterns CH1 and CH2. The etch stop layer 13 may be formed of or include at least one of silicon nitride, metal oxide, or silicon oxynitride and may have a single- or multi-layered structure. A fifth interlayer insulating layer 15 may be disposed on the etch stop layer 13. The fifth interlayer insulating layer 15 may be formed of or include at least one of silicon oxide, silicon nitride, or silicon oxynitride and may have a single- or multi-layered structure.

Second trenches TR2 may be formed in an upper portion of the fifth interlayer insulating layer 15. The second trenches TR2 may be two-dimensionally arranged in the first and second directions X1 and X2. Each second trench TR2 may overlap both of the first and second channel patterns CH1 and CH2 that are connected to one bit line contact set BLCS. The second trench TR2 may have a bottom surface TR2_B that is spaced apart from the etch stop layer 13. First and second electrode holes BH1 and BH2, which are spaced apart from each other, may be formed through the bottom surface TR2_B of each of the second trenches TR2. The first electrode hole BH1 may expose a top surface of the etch stop layer 13 on the first channel pattern CH1. An insulating gapfill layer 19 may be disposed on a bottom of the first electrode hole BH1. The insulating gapfill layer 19 may be formed of or include at least one of silicon oxide, silicon nitride, silicon oxynitride, and/or metal oxide. The second electrode hole BH2 may be provided to expose the second channel pattern CH2.

A bottom electrode BE may be provided to cover an inner side surface and the bottom surface TR2_B of the second trench TR2, an inner side surface and a bottom surface of the second electrode hole BH2, and an inner side surface of the first electrode hole BH1. In an embodiment, the bottom electrode BE may be formed of or include a metal-containing layer. For example, the bottom electrode BE may be formed of or include titanium nitride. As shown in FIG. 1B, the bottom electrode BE may include a first electrode portion BP1, which is provided in the first electrode hole BH1, a second electrode portion BP2, which is provided in the second electrode hole BH2, and an intermediate portion BPM, which is located on the bottom surface TR2_B of the second trench TR2 to connect the first electrode portion BP1 to the second electrode portion BP2. A top surface of the intermediate portion BPM may be lower than top ends of the first and second electrode portions BP1 and BP2.

A dielectric layer DL and a top electrode TE may be sequentially disposed on the bottom electrode BE. The dielectric layer DL may have a single- or multi-layered structure including at least one of a silicon oxide layer, a high-k dielectric layer having a higher dielectric constant than silicon oxide, a ferroelectric layer, and/or a ferromagnetic layer. In an embodiment, the high-k dielectric layer may be formed of or include at least one of metal oxide materials.

The ferroelectric layer may have a ferroelectric property. For example, the ferroelectric layer may have a single- or multi-layered structure including at least one of hafnium oxide, hafnium zirconium oxide, barium strontium titanium oxide, barium titanium oxide, or lead zirconium titanium oxide.

The ferroelectric layer may be doped with dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one, for example, zirconium (Zr), silicon (Si), aluminum (Al), yttrium (Y), gadolinium (Gd), lanthanum (La), scandium (Sc), or strontium (Sr). The ferroelectric layer may have a multi-layered structure that is composed of at least two ferroelectric layers having different chemical compositions.

The top electrode TE may be formed of a metal-containing layer (e.g., titanium nitride). The bottom electrode BE, the dielectric layer DL, and the top electrode TE may constitute a capacitor CAP. In an embodiment, the capacitors CAP may be two-dimensionally arranged to be spaced apart from each other in the first and second directions X1 and X2.

On the bottom of the first electrode hole BH1, the top electrode TE may penetrate the dielectric layer DL, the insulating gapfill layer 19, and the etch stop layer 13 and may be in contact with the first channel pattern CH1. A gapfill electrode pattern PE may be disposed on the top electrode TE to fill the second trench TR2 and the first and second electrode holes BH1 and BH2. The gapfill electrode pattern PE may be formed of or include at least one of conductive materials (e.g., doped polysilicon, doped silicon germanium, tungsten, aluminum, copper, ruthenium, molybdenum, and/or iridium). The top electrode TE may have a 'W'-shaped section. In an embodiment, the fifth interlayer insulating layer 15, the bottom electrode BE, the dielectric layer DL, and the gapfill electrode pattern PE may have top surfaces that are coplanar with each other.

Referring to FIGS. 1A to 3, the first and second channel patterns CH1 and CH2, which are connected to one bit line contact set BLCS in contact with one bit line set BLS, the word line WL, which is provided between them, and one capacitor CAP, which is connected to the first and second channel patterns CH1 and CH2, may constitute a memory cell MC. In an embodiment, a plurality of the memory cells MC may be two-dimensionally arranged in the first and second directions X1 and X2.

In each of the memory cell MC, the word line WL and the first channel pattern CH1 adjacent thereto may constitute a first transistor TX1. The first pattern portion C1 of the first channel pattern CH1 may correspond to a first terminal of the first transistor TX1 and may be connected to the first bit line BL1 through the first bit line contact BLC1. The second pattern portion C2 of the first channel pattern CH1 may correspond to a channel portion of the first transistor TX1. The third pattern portion C3 of the first channel pattern CH1 may correspond to a second terminal of the first transistor TX1 and may be connected to the top electrode TE of the capacitor CAP.

In each of the memory cells MC, the word line WL and the second channel pattern CH2 adjacent thereto may constitute a second transistor TX2. The first pattern portion C1 of the second channel pattern CH2 may correspond to a first terminal of the second transistor TX2 and may be connected to the second bit line BL2 through the second bit line contact BLC2. The second pattern portion C2 of the second channel pattern CH2 may correspond to a channel portion of the second transistor TX2. The third pattern portion C3 of the second channel pattern CH2 may correspond to a second terminal of the second transistor TX2 and may be connected to the bottom electrode BE of the capacitor CAP. The first transistor TX1 and the second transistor TX2 may share the word line WL.

In the circuit diagram of FIG. 3, the first transistor TX1 and the second transistor TX2 in each of the memory cells MC may be symmetrically provided to share the word line WL. The transistors TX1 and TX2 may be connect to both terminals of each of the capacitor CAP. The capacitor CAP may have a bended or folded shape, as shown in FIG. 1B or 2.

Thus, the semiconductor memory device 100 may be provided in the form of a folded 2T-1C DRAM device having two transistors and one capacitor.

Each memory cell MC in the semiconductor memory device 100 may be programmed, read, and erased by operation voltages shown in the following table 1.

TABLE 1

|  | Program | Read | Erase |
| --- | --- | --- | --- |
| BL1 | 0 V | $\frac{1}{2}$ Vcc | Vcc |
| BL2 | Vcc | $\frac{1}{2}$ Vcc | 0 V |
| WL | Vpass | Vpass | Vpass |

Figure 4:
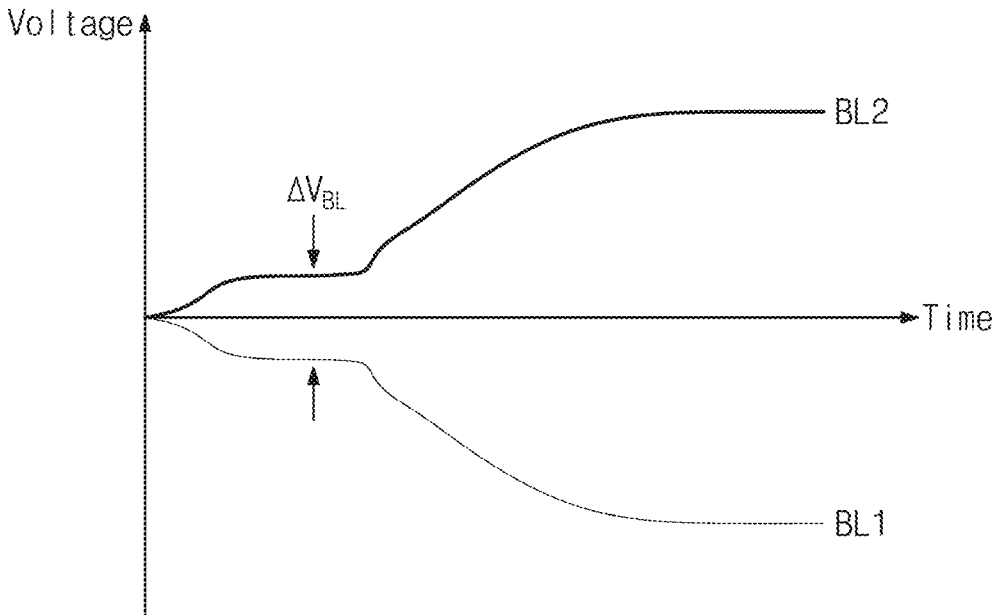
FIG. 4 is a graph showing a sensing margin in a semiconductor memory device according to an embodiment of inventive concepts.

FIG. 4 is a graph showing a sensing margin in a semiconductor memory device according to an embodiment of inventive concepts.

Referring to FIG. 4, in the semiconductor memory device 100 according to the present embodiment, during a programming operation, a voltage of the second bit line BL2 may be applied to the bottom electrode BE of the capacitor CAP through the second transistor TX2, and a voltage of the first bit line BL1 may be applied to the top electrode TE of the capacitor CAP through the first transistor TX1. This may make it possible to increase an electrostatic capacitance of the capacitor CAP. Thus, during a reading operation, a gap between the voltages of the first and second bit lines BL1 and BL2 is increased as shown in FIG. 4, a sensing margin ($\Delta V_{BL}$) may be increased.

In a conventional DRAM structure, all of the top electrodes are connected to a plate electrode and are applied with a common voltage. Thus, the capacitor is controlled by only a voltage applied to the bottom electrode, and this may lead to a difficulty in increasing an electrostatic capacitance of the capacitor and a sensing margin during an operation of the DRAM device. That is, in a conventional DRAM structure, an electrostatic capacitance of the capacitor and a sensing margin may become relatively small in comparison with an embodiment of inventive concepts.

Thus, the semiconductor memory device 100 according to an embodiment of inventive concepts may have an improved sensing margin. Furthermore, the semiconductor memory device 100 according to an embodiment of inventive concepts may be free from a noise issue caused by the plate electrode, because the top electrodes TE are not connected to the plate electrode. Accordingly, it may be possible to improve reliability of the semiconductor memory device 100. In addition, the bottom electrode BE may have a bent profile, because it is disposed in the first and second electrode holes BH1 and BH2 and the second trench TR2. That is, the bottom electrode BE may have a structure in which a cylindrical shape is folded or bent. Thus, even when a height of the bottom electrode BE is not increased, it may be possible to increase an area between the bottom electrode BE and the top electrode TE and consequently to increase a capacitance therebetween. Furthermore, it may be easy to connect interconnection lines to the capacitor CAP, the word line WL, and the bit lines BL1 and BL2. That is, in the semiconductor memory device 100 according to an embodiment of inventive concepts, it may be possible to increase a degree of freedom in constructing a routing structure.

FIGS. 5A to 17A and 19A are plan views sequentially illustrating a process of fabricating a semiconductor memory device having the planar structure of FIG. 1A. FIGS. 5B to 17B, 18A, 18B, and 19B are sectional views sequentially illustrating a process of fabricating a semiconductor memory device having the sectional structure of FIG. 1B. FIGS. 5C to 17C and 19C are sectional views sequentially illustrating a process of fabricating a semiconductor memory device having the sectional structure of FIG. 1C.

Figure 5A:
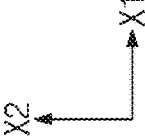
Figure 5B:
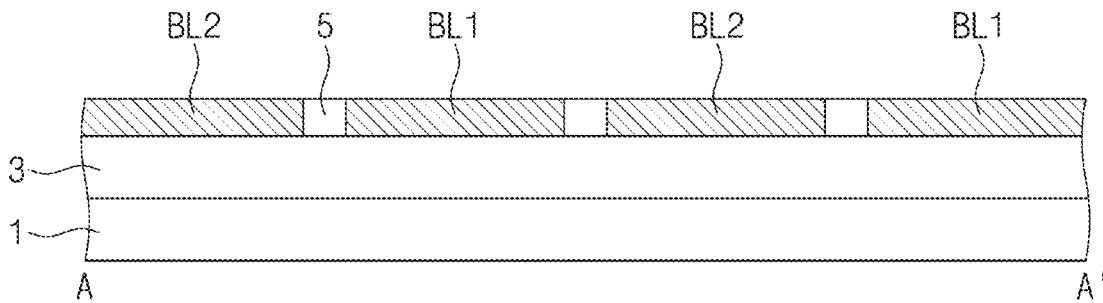
Figure 5C:
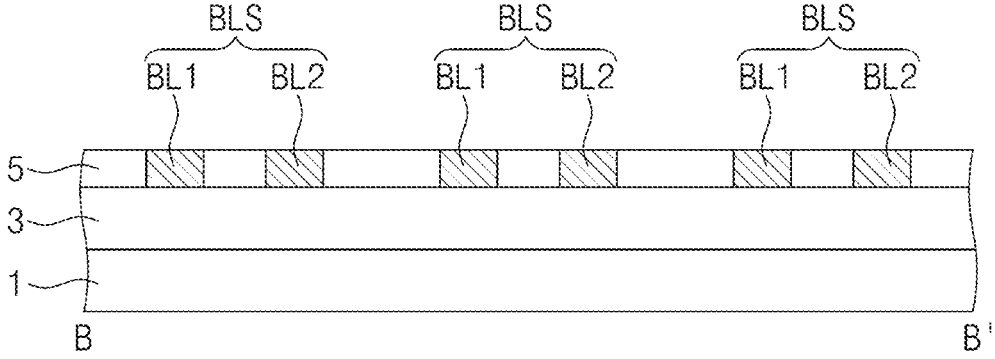

Referring to FIGS. 5A to 5C, the first interlayer insulating layer 3 may be formed on the substrate 1. The first and second bit lines BL1 and BL2 may be formed to be alternately arranged on the first interlayer insulating layer 3. The first and second bit lines BL1 and BL2, which are alternately arranged, may constitute the bit line sets BLS, each of which is composed of an adjacent pair of the first and second bit lines BL1 and BL2. In other words, one first bit line BL1 and one second bit line BL2 adjacent thereto may constitute one bit line set BLS. The first distance DS1 between the pair of the first and second bit lines BL1 and BL2 constituting each bit line set BLS may be smaller than the second distance DS2 between the bit line sets BLS. A second interlayer insulating layer 5 may be formed to fill a space between the first and second bit lines BL1 and BL2.

Figure 6A:
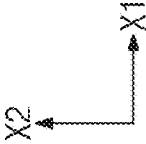
Figure 6B:
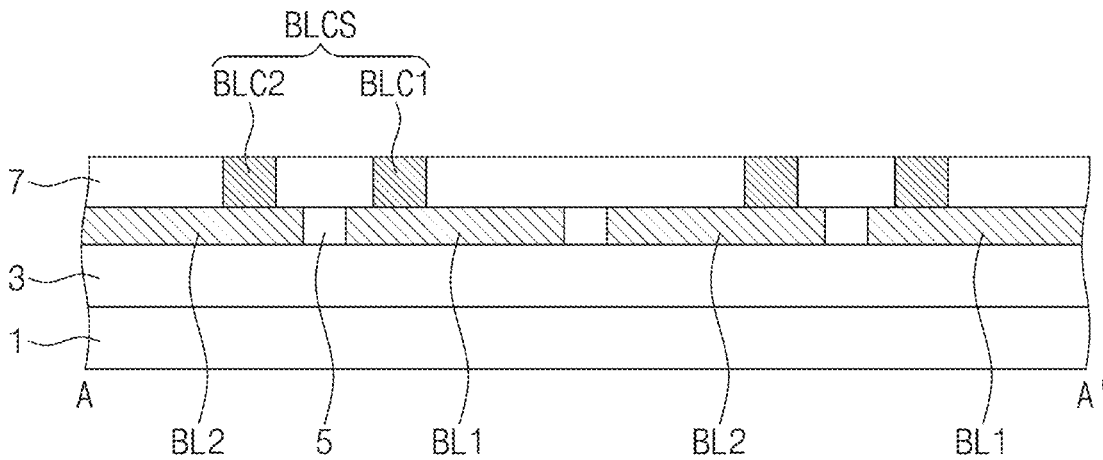
Figure 6C:
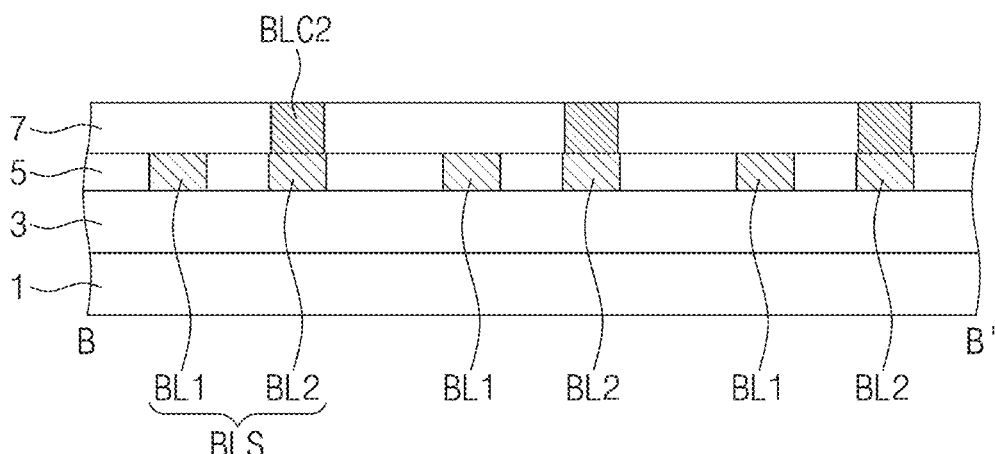

Referring to FIGS. 6A to 6C, a third interlayer insulating layer 7 may be formed to cover the first and second bit lines BL1 and BL2 and the second interlayer insulating layer 5.

The third interlayer insulating layer 7 may be etched to form contact holes exposing the first and second bit lines BL1 and BL2, and the first and second bit line contacts BLC1 and BLC2 may be formed by filling the contact holes with a conductive layer. Adjacent ones of the first and second bit line contacts BLC1 and BLC2, which are provided on each bit line set BLS, may constitute the bit line contact sets BLCS. Each bit line contact set BLCS may include one first bit line contact BLC1 and one second bit line contact BLC2 adjacent thereto. The third distance DS3 between an adjacent pair of the first and second bit line contacts BLC1 and BLC2 in each bit line contact set BLCS may be smaller than the fourth distance DS4 between adjacent ones of the bit line contact sets BLCS.

Figure 7A:
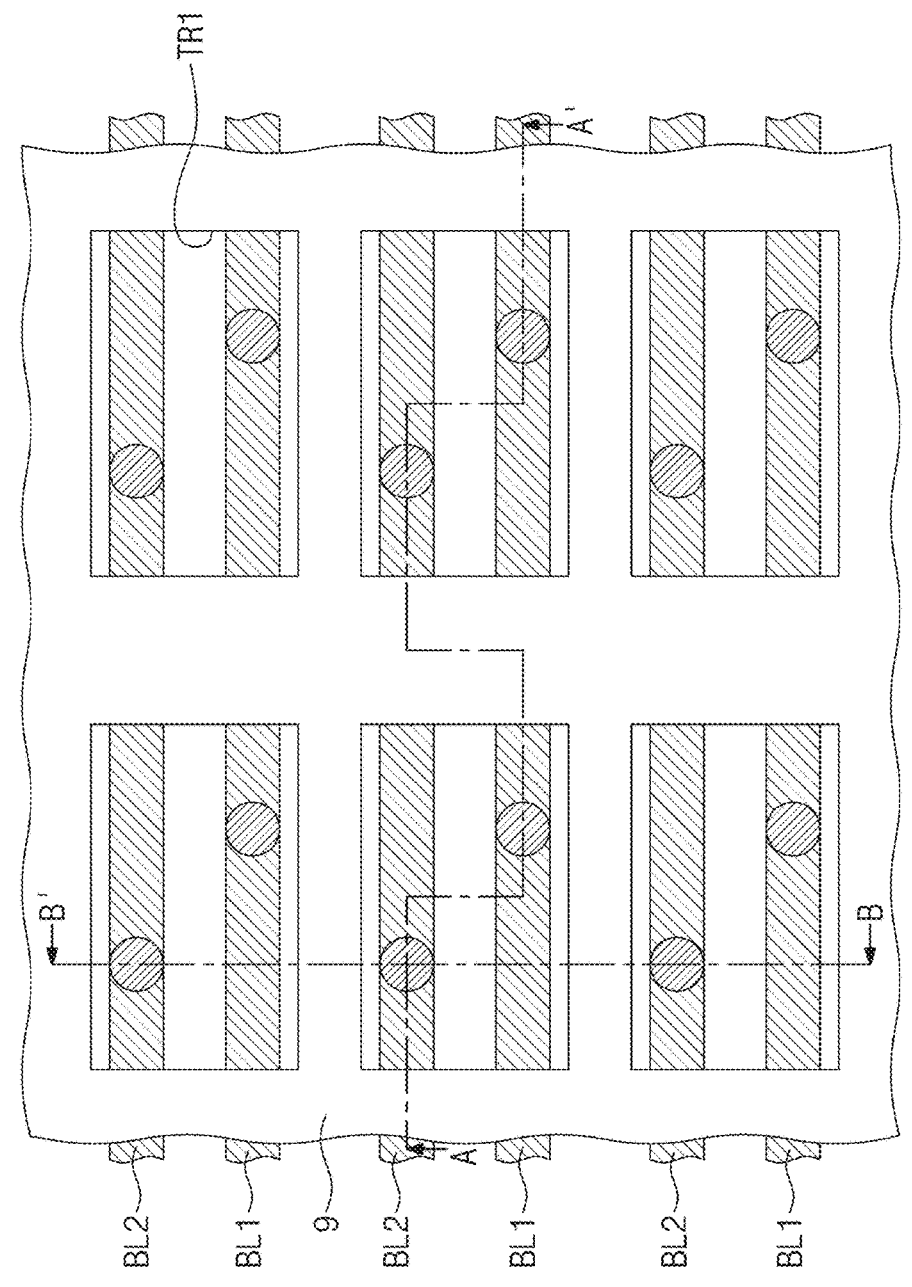
Figure 7A:
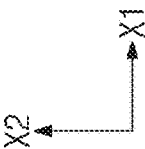
Figure 7B:
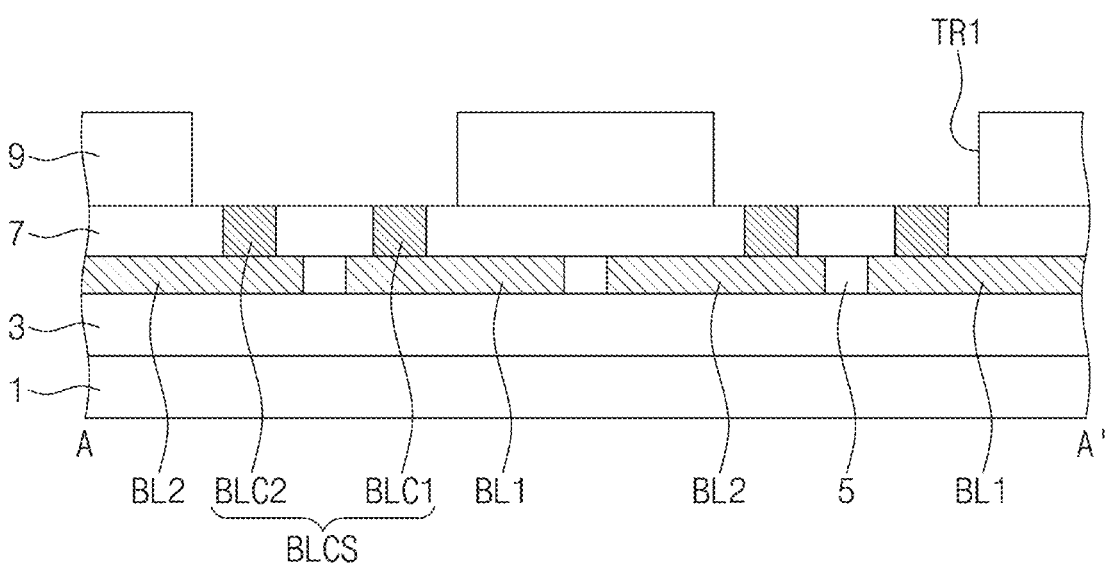
Figure 7C:
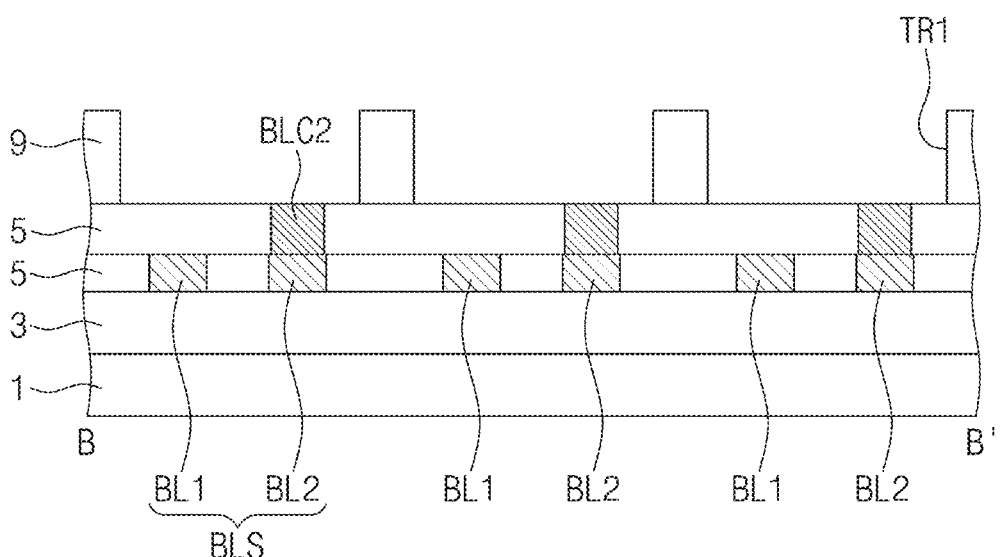

Referring to FIGS. 7A to 7C, a fourth interlayer insulating layer 9 may be formed on the third interlayer insulating layer 7. Thereafter, the fourth interlayer insulating layer 9 may be etched to form the first trenches TR1. Each of the first trenches TR1 may be formed to expose a corresponding one of the bit line contact sets BLCS and a top surface of the third interlayer insulating layer 7 adjacent thereto.

Figure 8A:
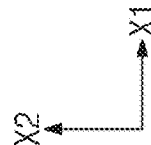
Figure 8B:
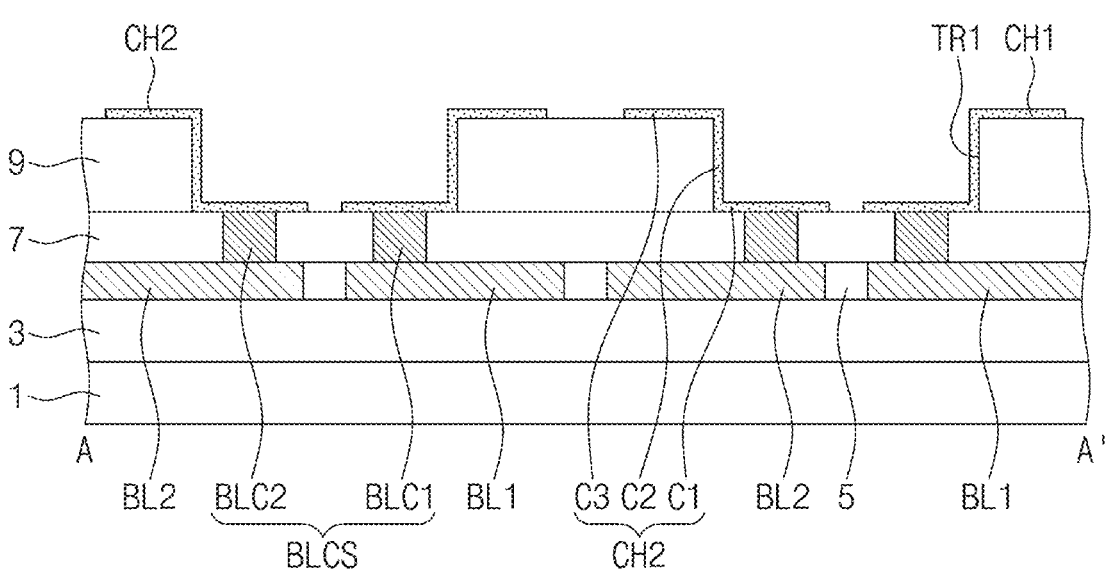
Figure 8C:
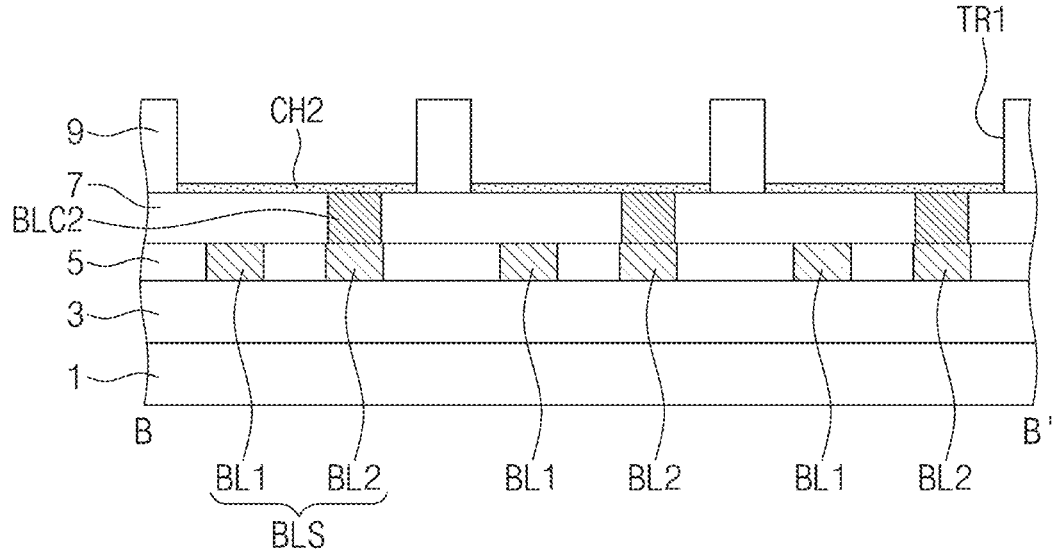

Referring to FIGS. 8A to 8C, a channel layer (not shown) may be conformally formed on the structure provided with the first trenches TR1 and may be etched to form the first and second channel patterns CH1 and CH2. Each of the first and second channel patterns CH1 and CH2 may include the first pattern portion C1 covering the bottom surface of the first trench TR1, the second pattern portion C2 covering the side surface of the first trench TR1, and the third pattern portion C3 covering the top surface of the fourth interlayer insulating layer 9 outside the first trench TR1. The first and second channel patterns CH1 and CH2 may be provided to have mirror symmetric sections with respect to each other. The first channel pattern CH1 in each of the first trenches TR1 may be in contact with the first bit line contact BLC1. The second channel pattern CH2 in each of the first trenches TR1 may be in contact with the second bit line contact BLC2.

Figure 9A:
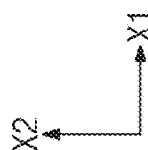
Figure 9B:
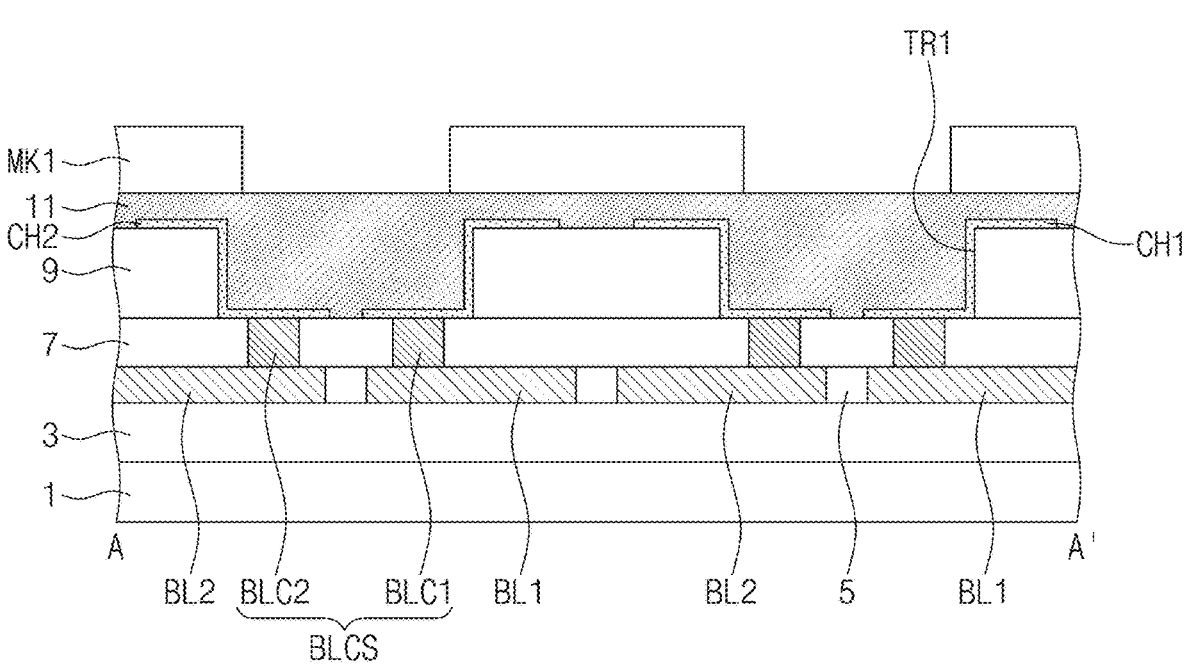
Figure 9C:
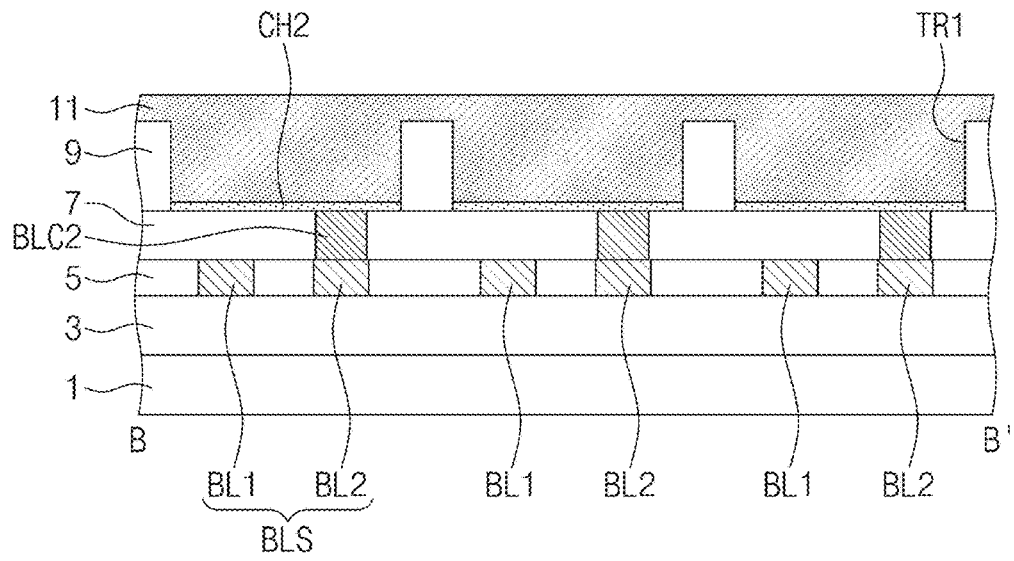

Referring to FIGS. 9A to 9C, a first sacrificial layer 11 may be formed on the substrate 1 to cover the first and second channel patterns CH1 and CH2 and the fourth interlayer insulating layer 9. The first sacrificial layer 11 may be formed to fill the first trenches TR1 and to have a flat top surface. The first sacrificial layer 11 may be formed of at least one of materials (e.g., spin-on-hardmask (SOH) materials) having an etch selectivity with respect to all of the first and second channel patterns CH1 and CH2 and the fourth interlayer insulating layer 9. First mask patterns MK1 may be formed on the first sacrificial layer 11. The first mask patterns MK1 may be line-shaped patterns, which are extending in the second direction X2, and may be spaced apart from each other in the first direction X1. A space between the first mask patterns MK1 may overlap the first trenches TR1. The first mask patterns MK1 may be formed of a material having an etch selectivity with respect to both of the first sacrificial layer 11 and the fourth interlayer insulating layer 9. For example, the first mask patterns MK1 may be formed of or include silicon oxide.

Figure 10A:
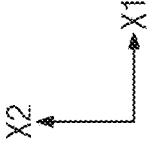
Figure 10B:
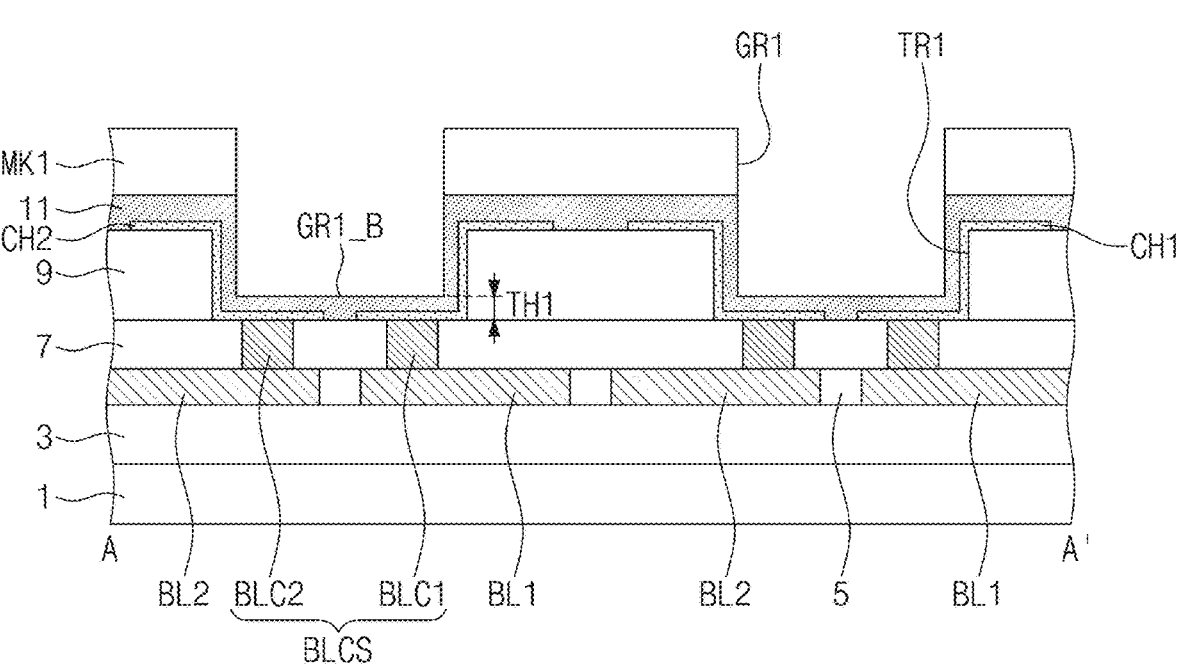
Figure 10C:
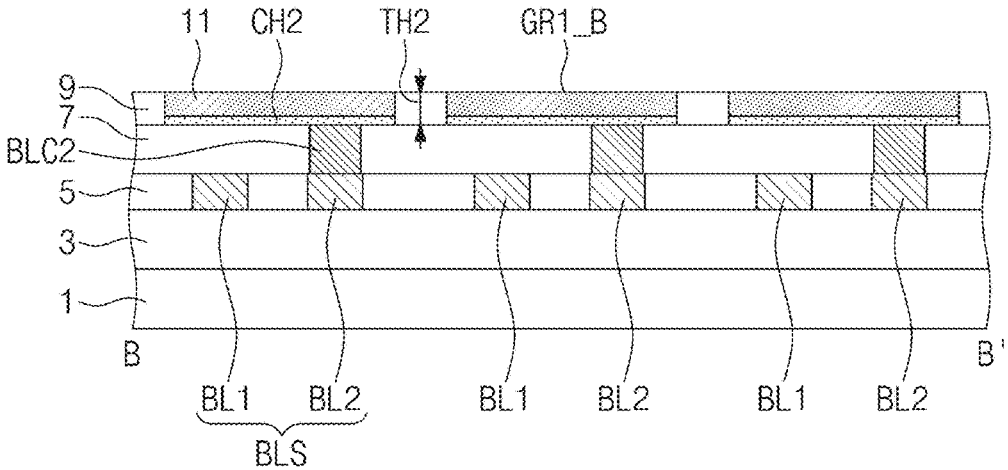

Referring to FIGS. 10A to 10C, the first sacrificial layer 11 may be etched using the first mask patterns MK1 as an etch mask. In an embodiment, the fourth interlayer insulating layer 9 between the first trenches TR1, which are adjacent to each other in the second direction X2, may also be etched during this etching process. Accordingly, the first groove GR1 may be formed in the first sacrificial layer 11 and the fourth interlayer insulating layer 9. Here, the largest thickness TH1 of the first sacrificial layer 11 on a bottom surface GR1_B of the first groove GR1 may be equal to a thickness TH2 of the fourth interlayer insulating layer 9 on the bottom surface GR1_B of the first groove GR1.

Figure 11A:
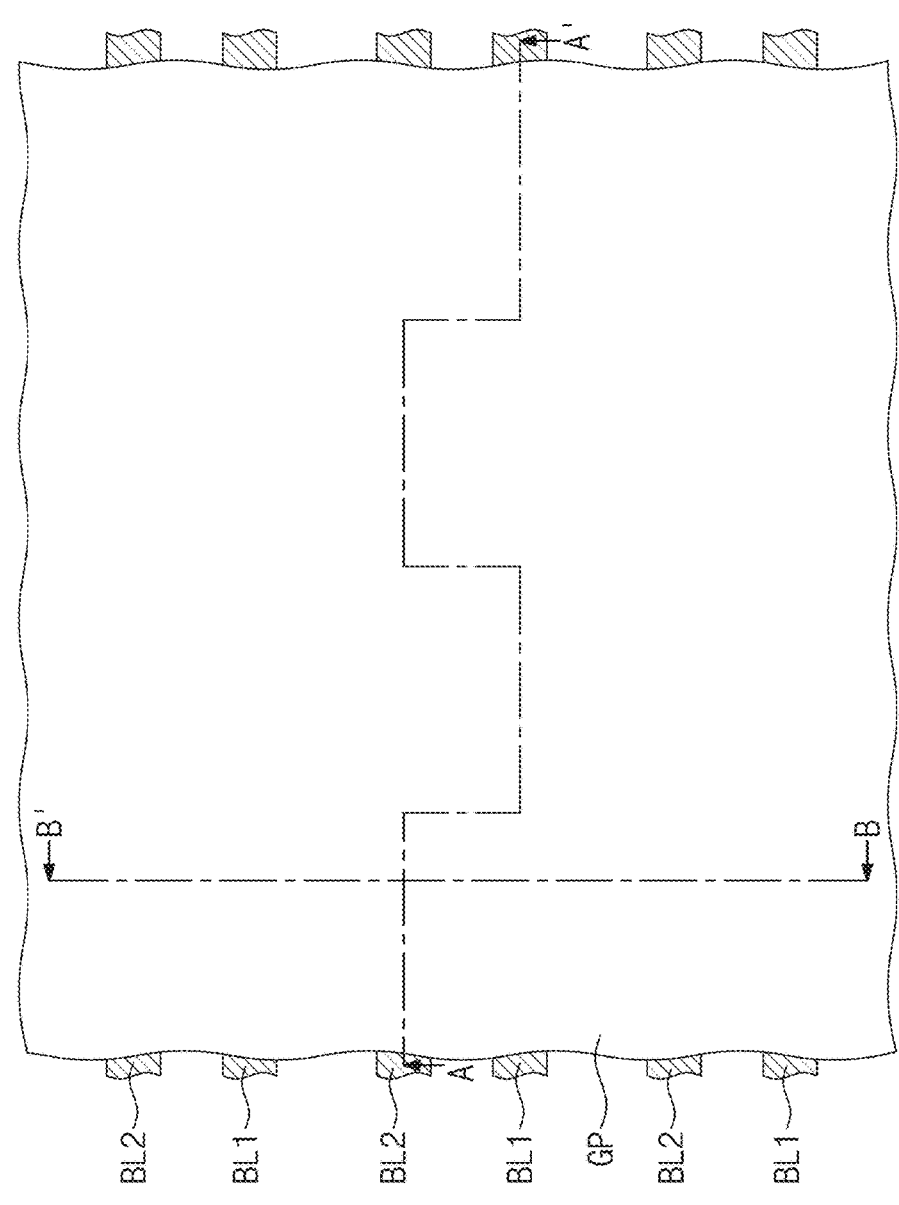
Figure 11A:
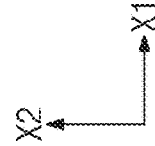
Figure 11B:
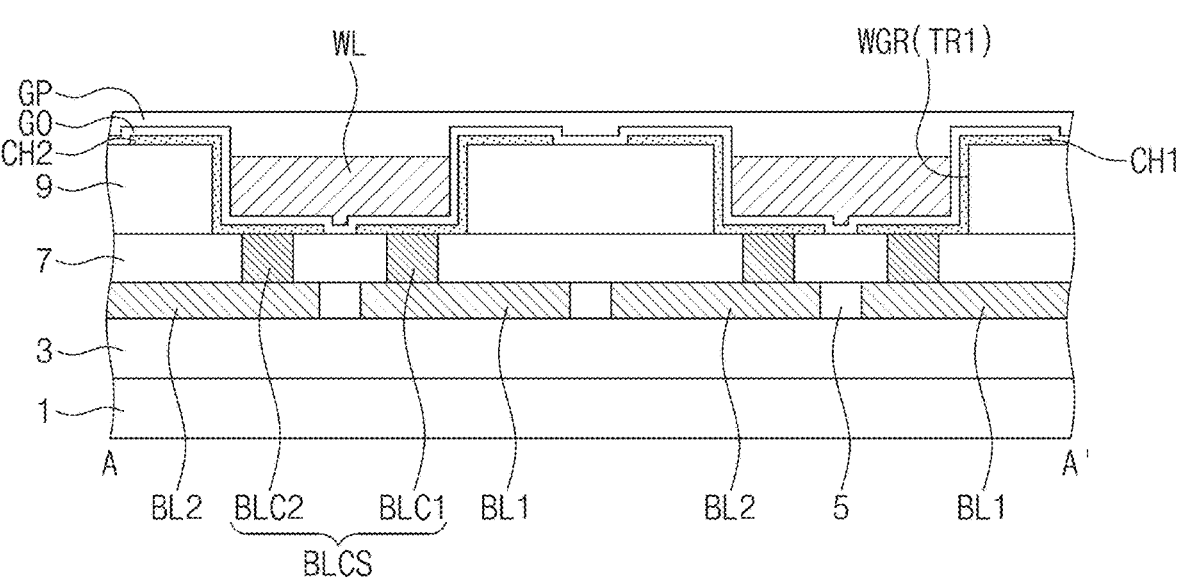
Figure 11C:
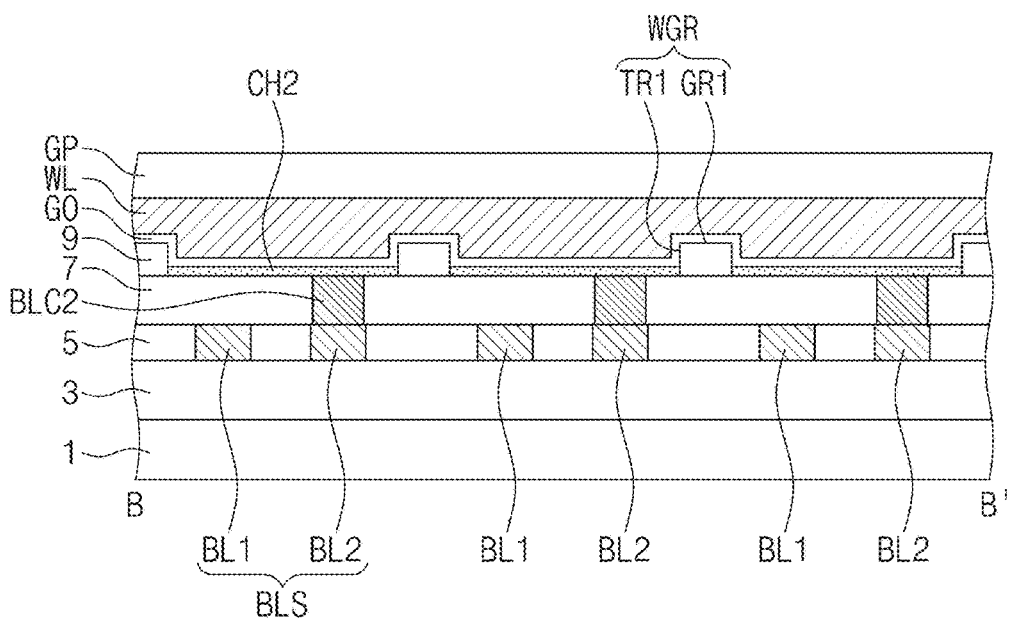

Referring to FIGS. 11A to 11C, the first mask patterns MK1 and the first sacrificial layer 11 may be removed to expose the first and second channel patterns CH1 and CH2 and the fourth interlayer insulating layer 9. As a result, the first groove GR1 and the first trenches TR1 may be connected to each other in the second direction X2 to form the word line groove WGR. The gate insulating layer GO may be conformally formed on the substrate 1. The gate insulating layer GO may conformally cover the first and second channel patterns CH1 and CH2 and the fourth interlayer insulating layer 9. A conductive layer may be formed on the gate insulating layer GO and may be etched to form the word line WL in the word line groove WGR. Thereafter, the word line capping layer GP may be formed on the substrate 1 to cover the word line WL.

Figure 12A:
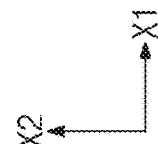
Figure 12B:
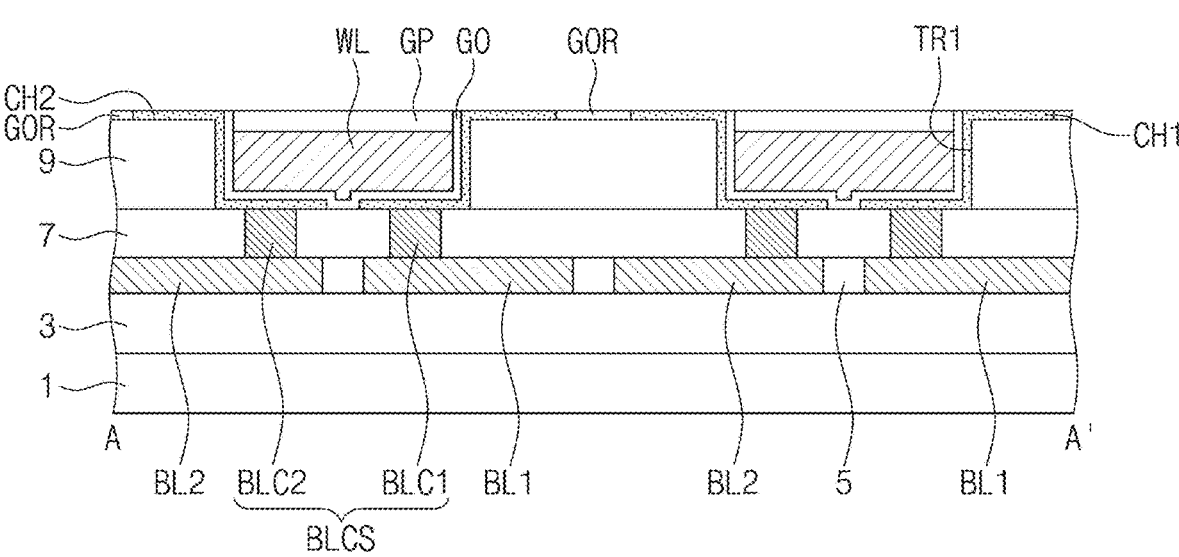
Figure 12C:
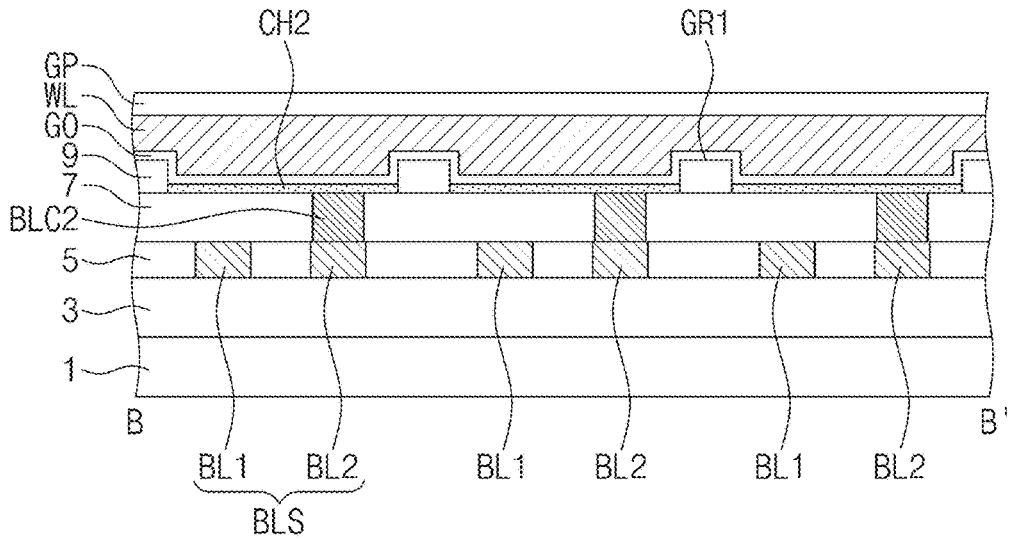

Referring to FIGS. 12A to 12C, an etch-back process may be performed on the word line capping layer GP and the gate insulating layer GO to remove the word line capping layer GP and the gate insulating layer GO on the first and second channel patterns CH1 and CH2 and to expose the first and second channel patterns CH1 and CH2. Here, the residual gate insulating layer GOR, which is a portion of the gate insulating layer GO, may be left between the first and second channel patterns CH1 and CH2.

Figure 13A:
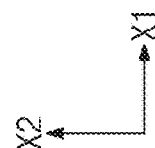
Figure 13B:
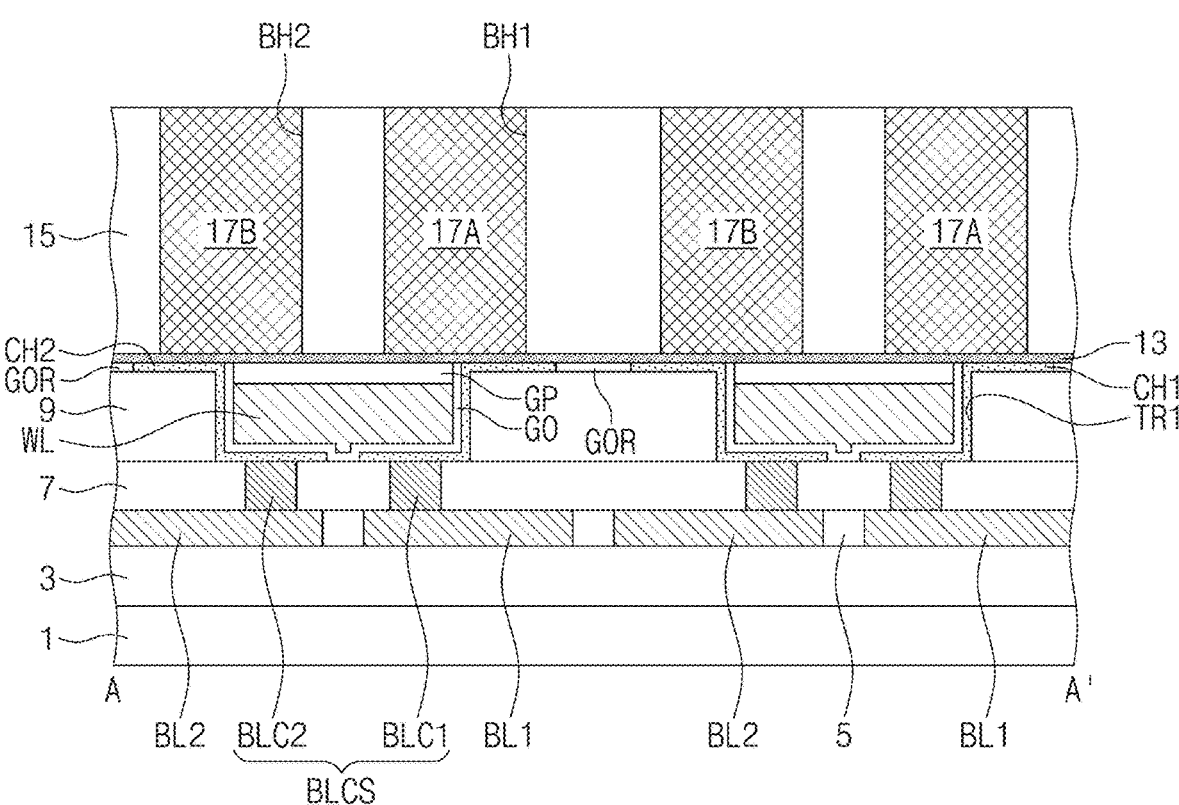
Figure 13C:
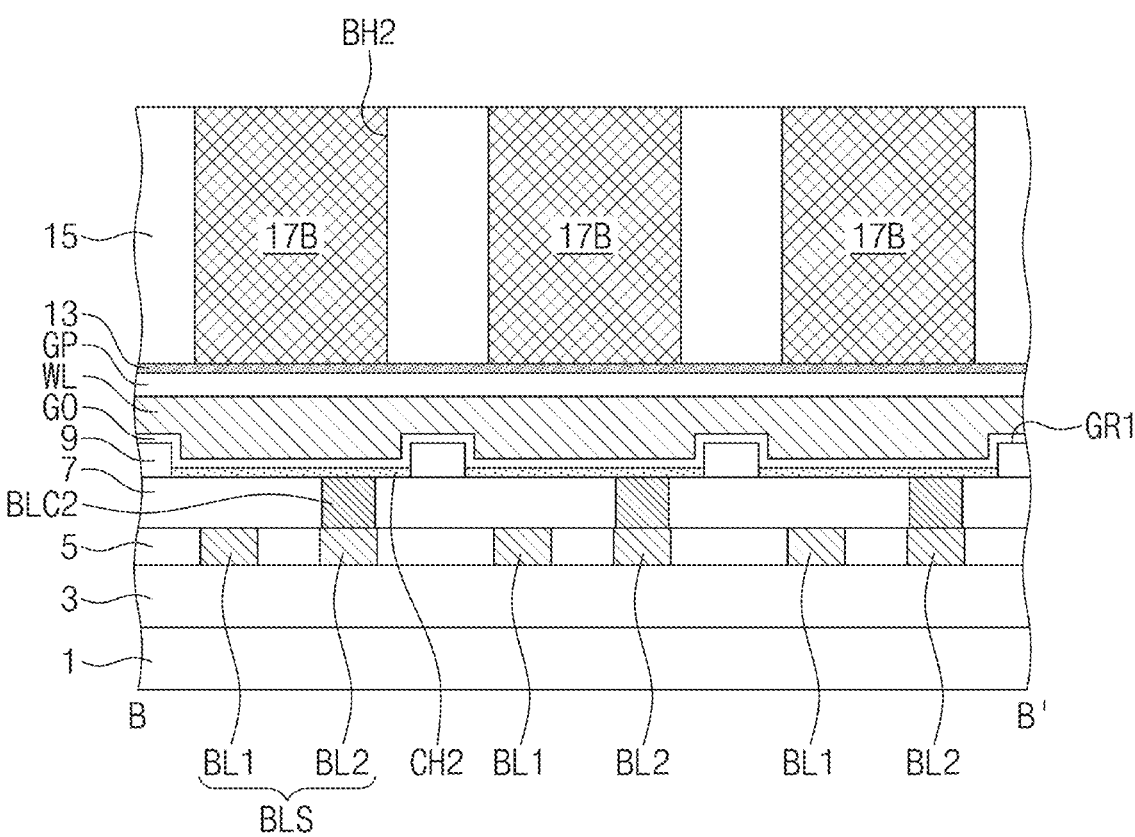

Referring to FIGS. 13A to 13C, the etch stop layer 13 may be formed on the substrate 1. A fifth interlayer insulating layer 15 may be formed on the etch stop layer 13. The fifth interlayer insulating layer 15 may be etched to form the first and second electrode holes BH1 and BH2. The first and second electrode holes BH1 and BH2 may be formed to expose the etch stop layer 13 on the first and second channel patterns CH1 and CH2. A sacrificial layer may be formed and may be etched back to form the first and second sacrificial patterns 17A and 17B filling the first and second electrode holes BH1 and BH2.

Figure 14A:
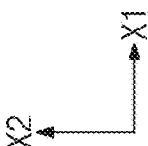
Figure 14B:
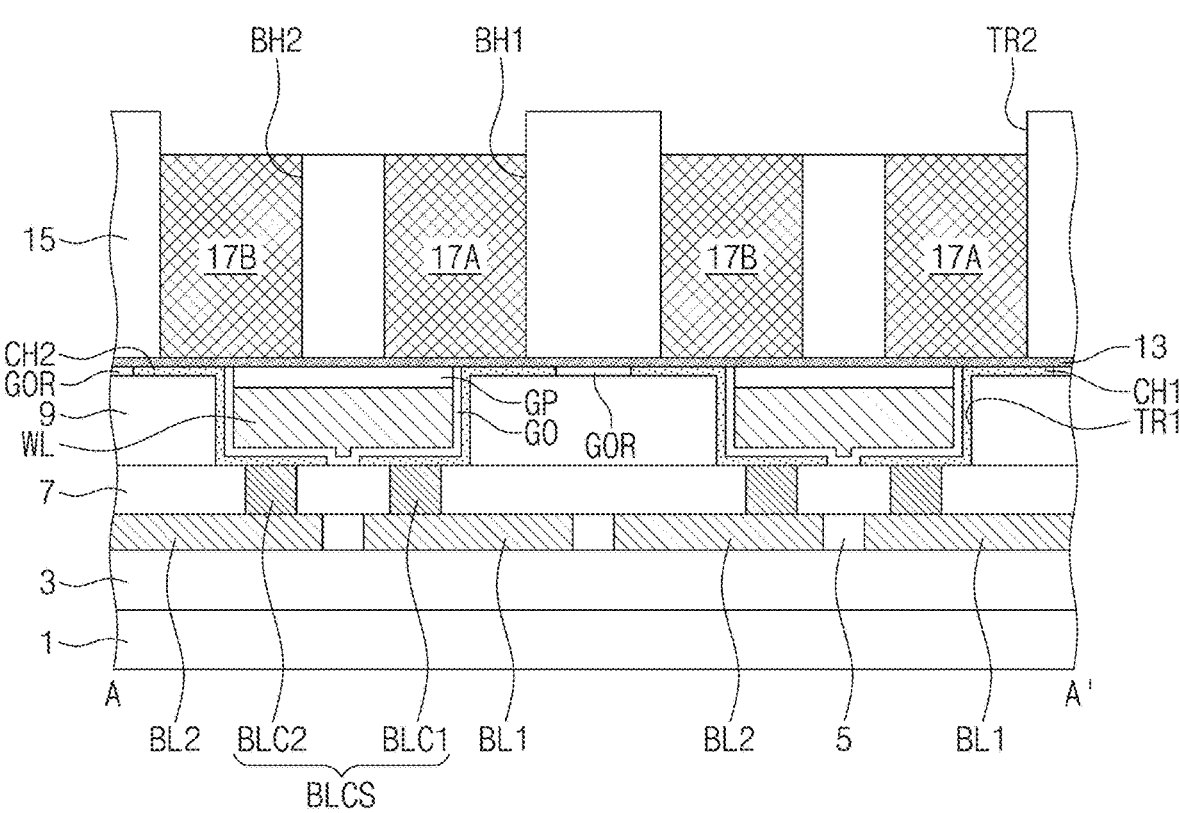
Figure 14C:
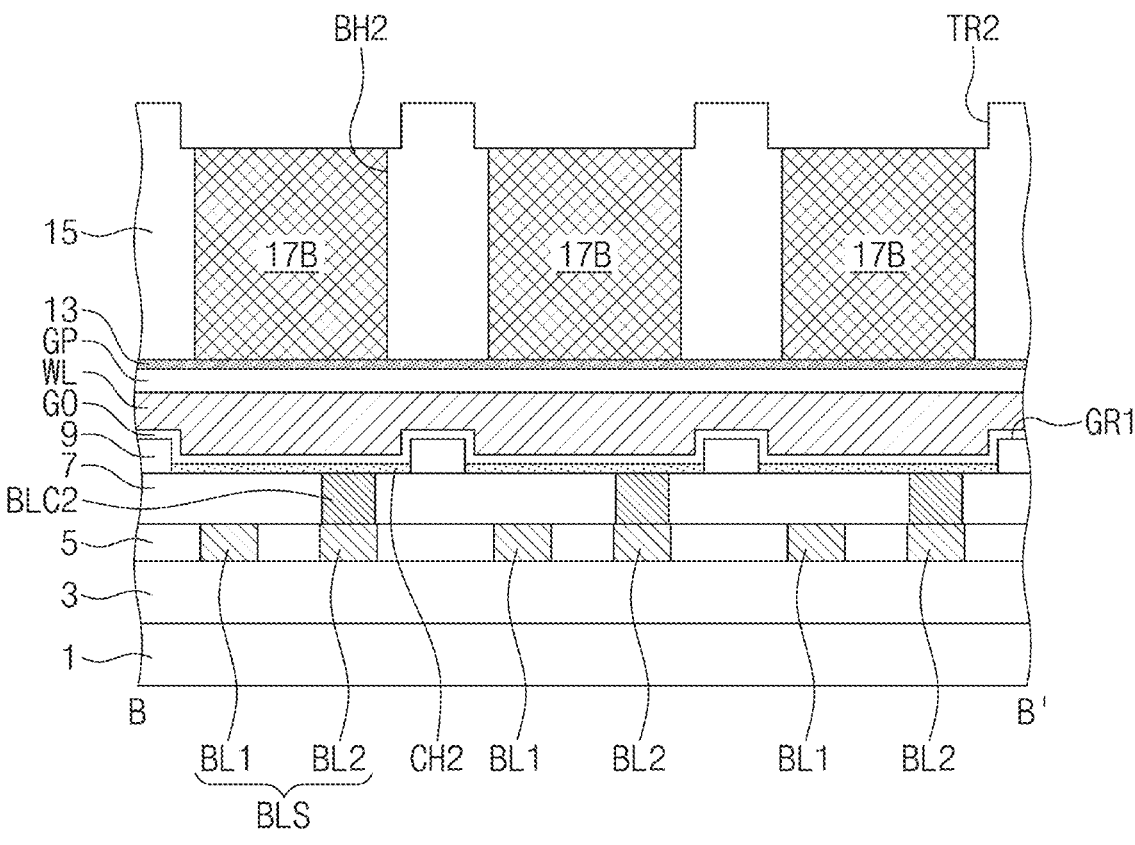

Referring to FIGS. 14A to 14C, the second trench TR2 may be formed by etching portions of the first and second sacrificial patterns 17A and 17B and the fifth interlayer insulating layer 15. In an embodiment, a plurality of the second trenches TR2 may be formed to be two-dimensionally arranged in the first and second directions X1 and X2. Each of the second trenches TR2 may overlap both of the first and second channel patterns CH1 and CH2 connected to one bit line contact set BLCS. The bottom surface TR2_B of the second trench TR2 may be spaced apart from the etch stop layer 13.

Figure 15A:
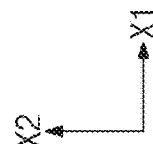
Figure 15B:
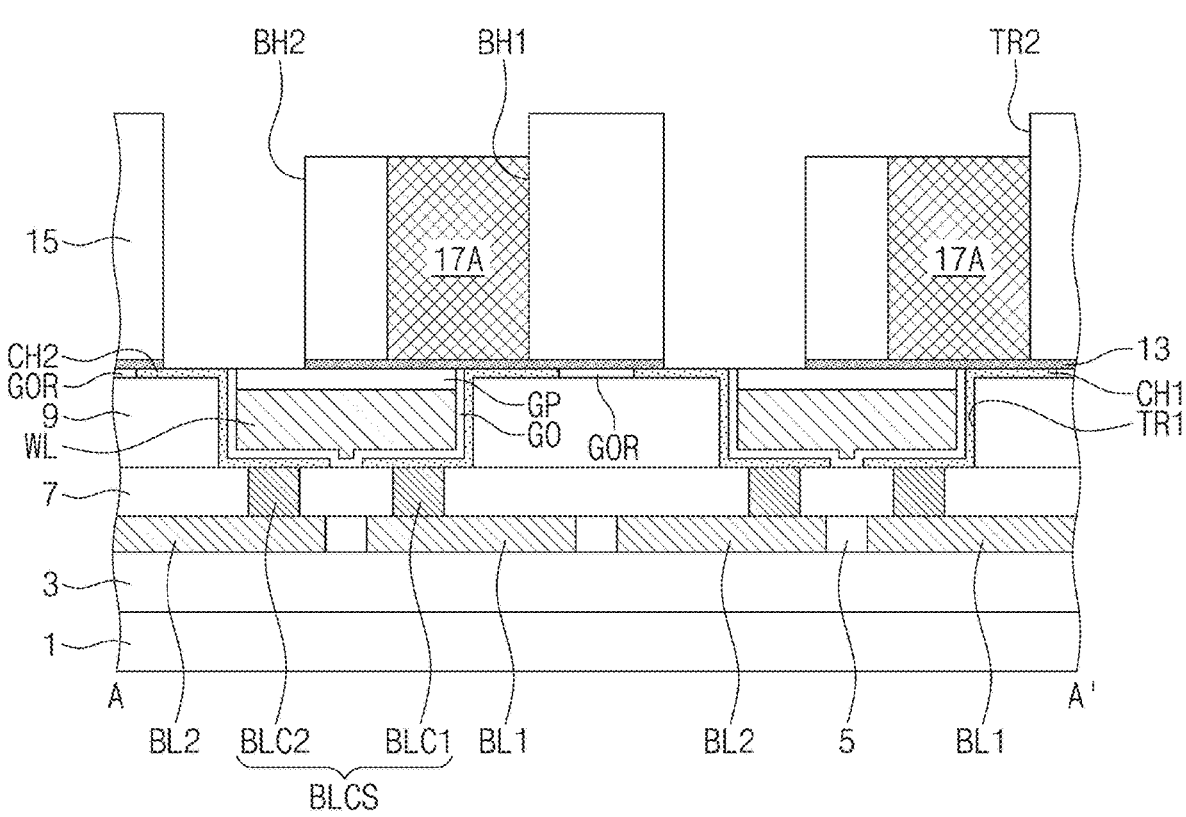
Figure 15C:
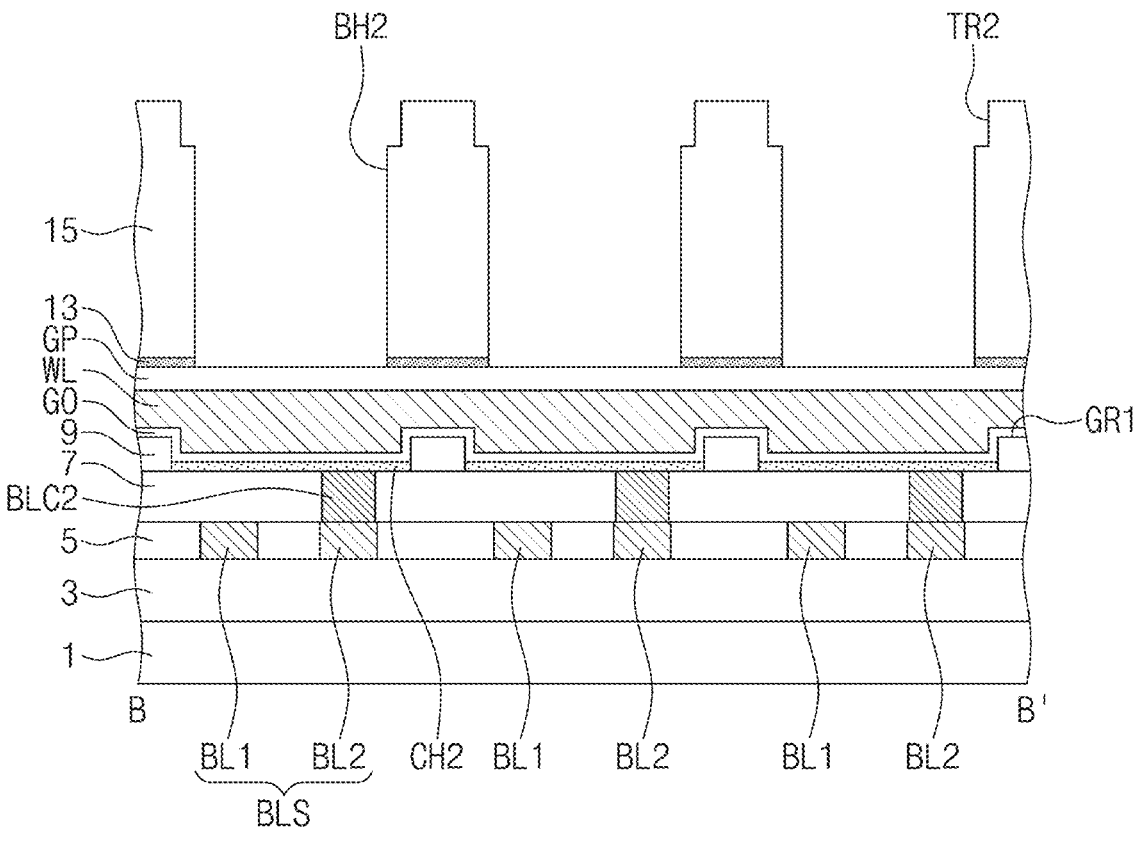
Figure 16A:
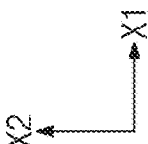
Figure 16B:
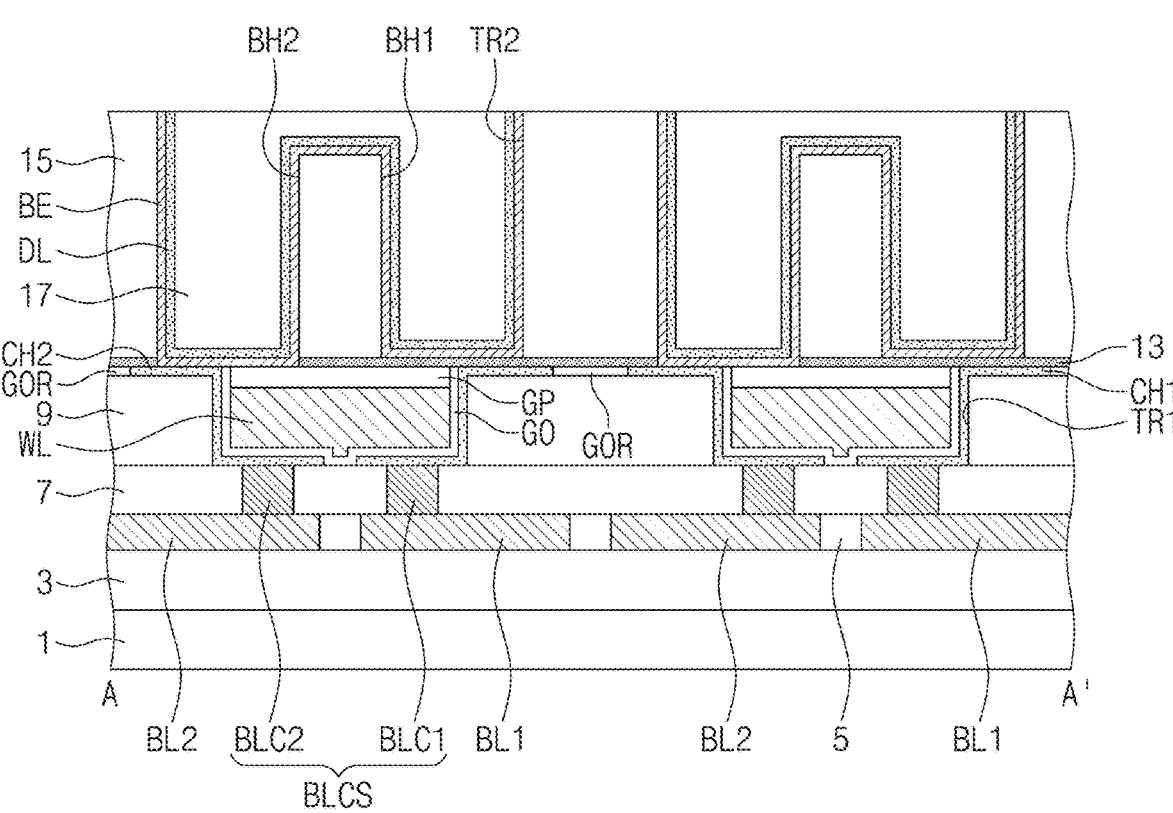
Figure 16C:
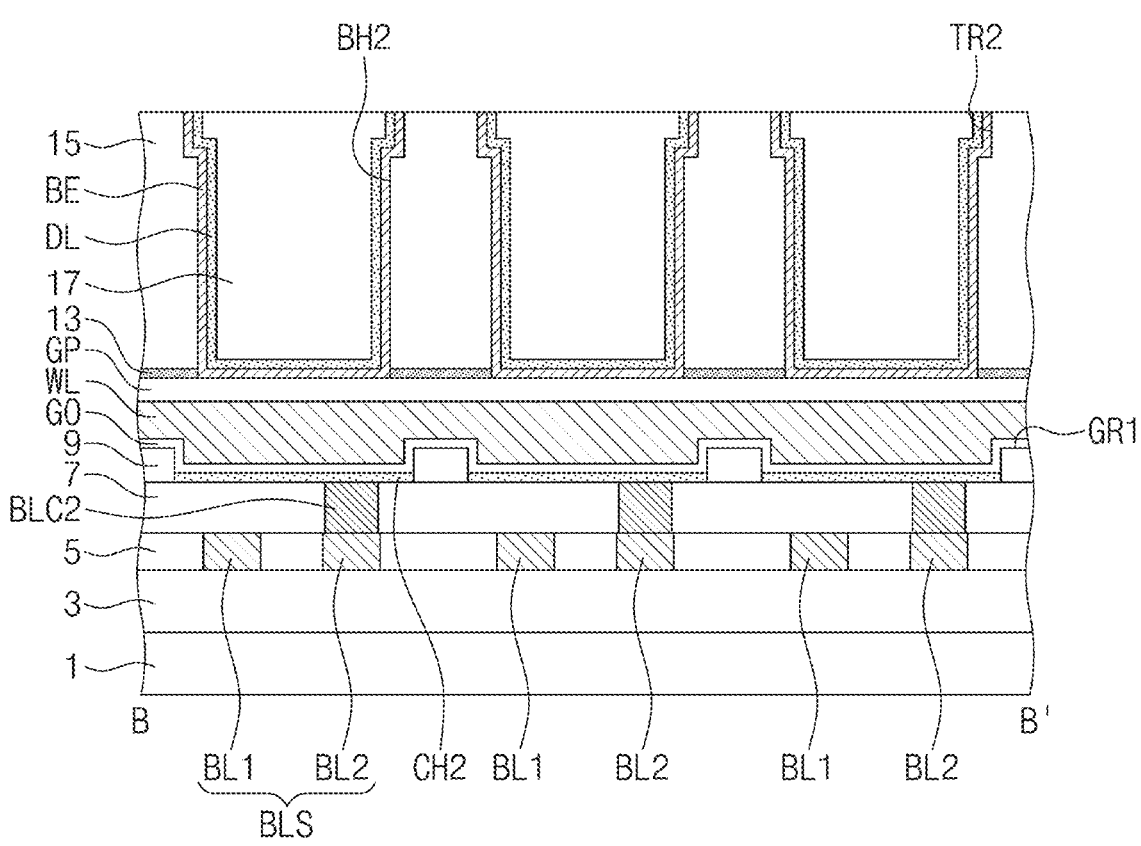

Referring to FIGS. 15A to 15C, the second sacrificial pattern 17B below the bottom surface TR2_B of the second trench TR2 and the etch stop layer 13 thereunder may be partially removed to expose the second channel pattern CH2. Accordingly, an inner side surface of the second electrode hole BH2 may be exposed.

Referring to FIGS. 15A to 15C and 16A to 16C, the first sacrificial patterns 17A may be removed. Accordingly, inner side surfaces of the first electrode holes BH1 and the etch stop layer 13 under the first electrode holes BH1 may be exposed. A bottom electrode layer and the dielectric layer DL may be conformally formed on the substrate 1. Next, a third sacrificial layer 17 may be formed to fill the second trench TR2 and the first and second electrode holes BH1 and BH2. In an embodiment, the third sacrificial layer 17 may be formed of or include at least one of SOH materials. A chemical mechanical polishing (CMP) process or an etch-back process may be performed to remove the third sacrificial layer 17, the dielectric layer DL, and the bottom electrode layer on the fifth interlayer insulating layer 15. Thus, the bottom electrode BE may be formed in the second trench TR2 and the first and second electrode holes BH1 and BH2.

Figure 17A:
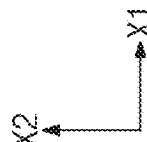
Figure 17B:
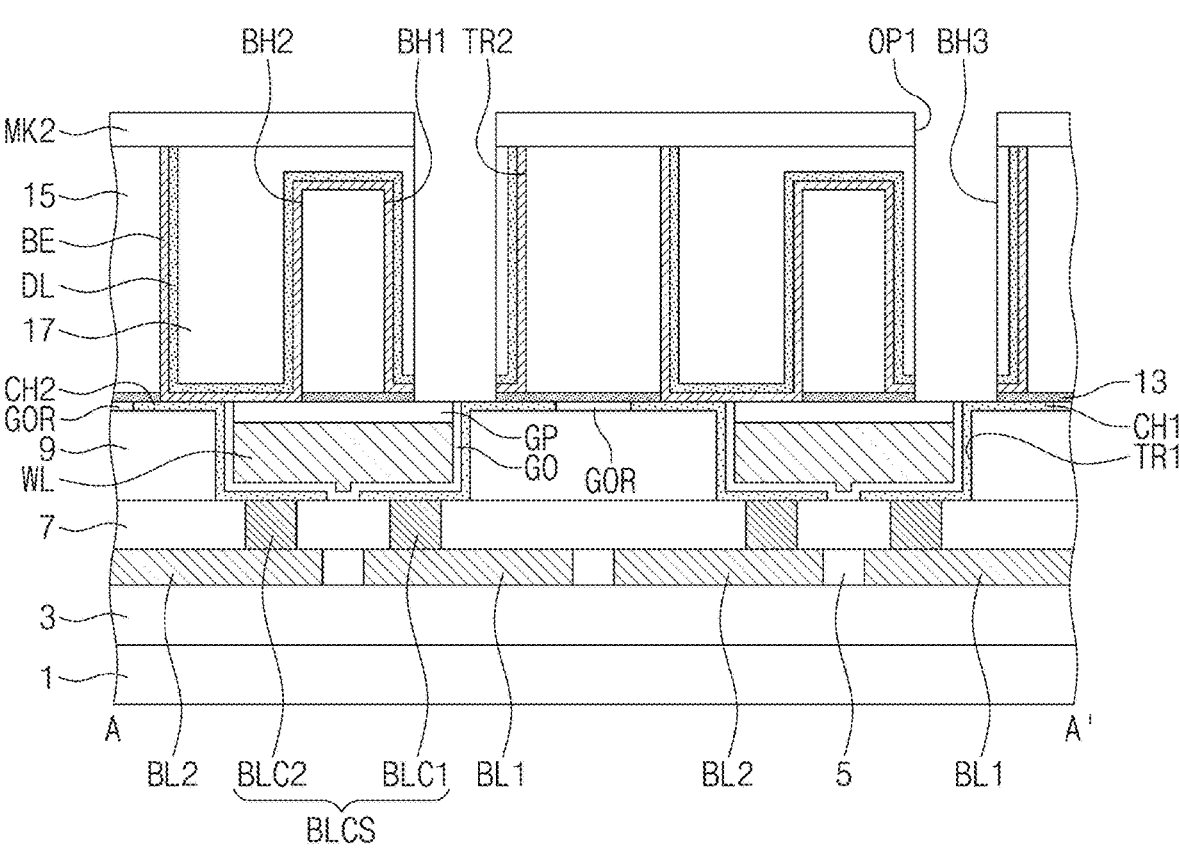
Figure 17C:
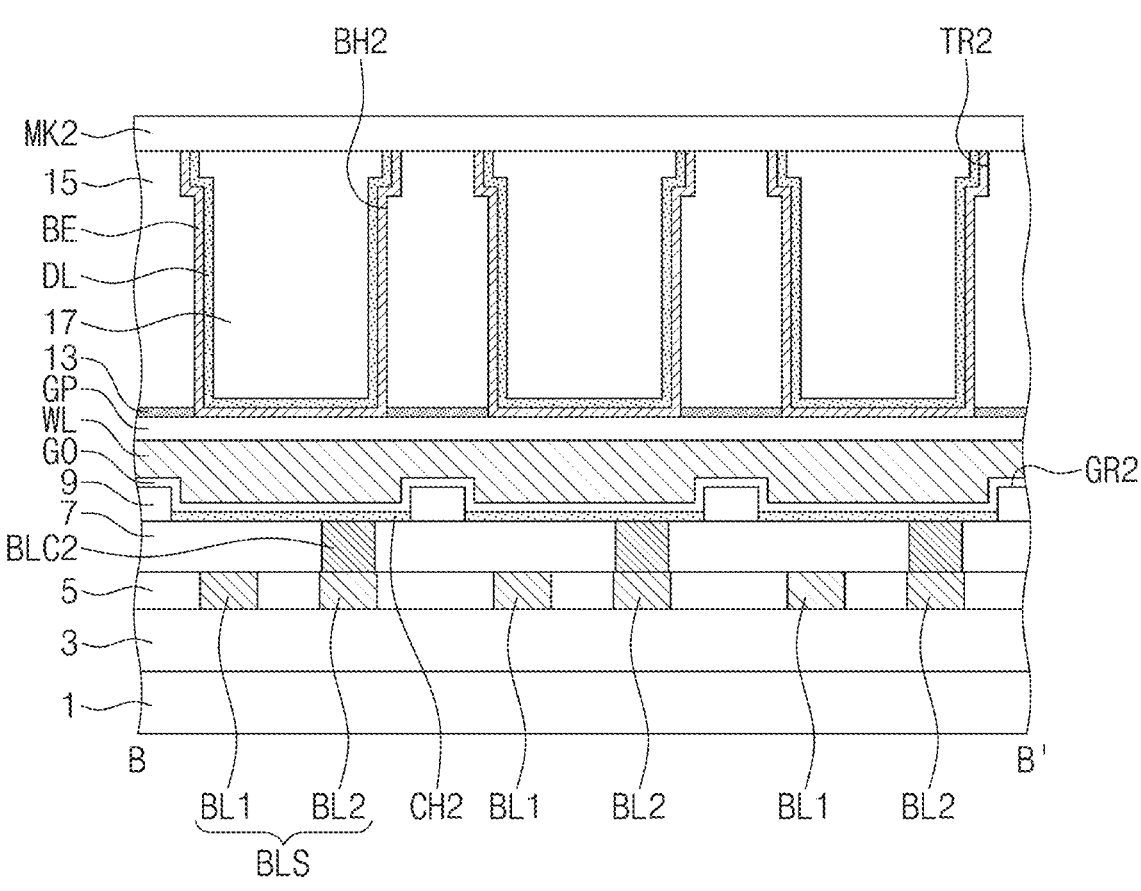

Referring to FIGS. 17A to 17C, a second mask pattern MK2 may be formed on the fifth interlayer insulating layer 15. The second mask pattern MK2 may have a first opening OP1 overlapping the first electrode hole BH1. A width of the first opening OP1 may be smaller than a width of the first electrode hole BH1. The third sacrificial layer 17 in the first electrode hole BH1 and the dielectric layer DL, the bottom electrode BE, and the etch stop layer 13 therebelow may be etched using the second mask pattern MK2 as an etch mask to form a third electrode hole BH3 exposing the first channel pattern CH1.

Figure 18A:
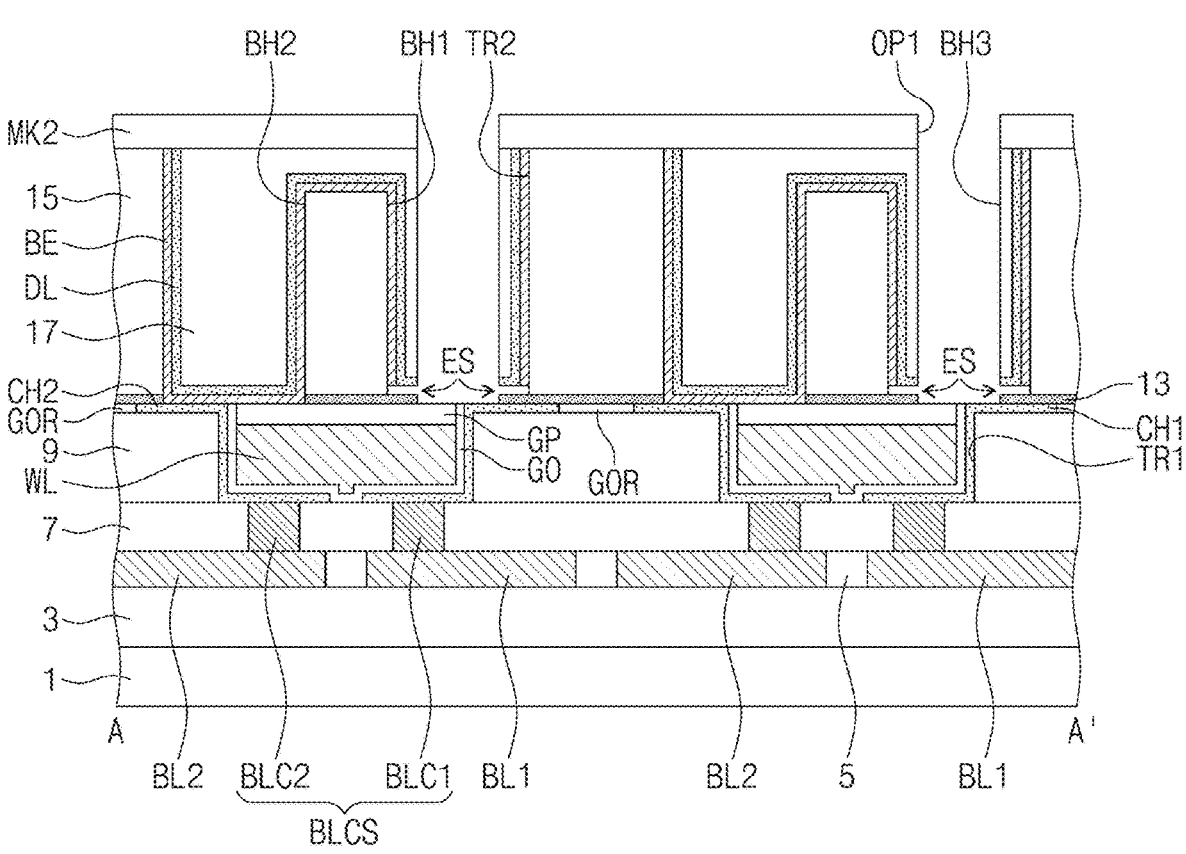
Figure 18B:
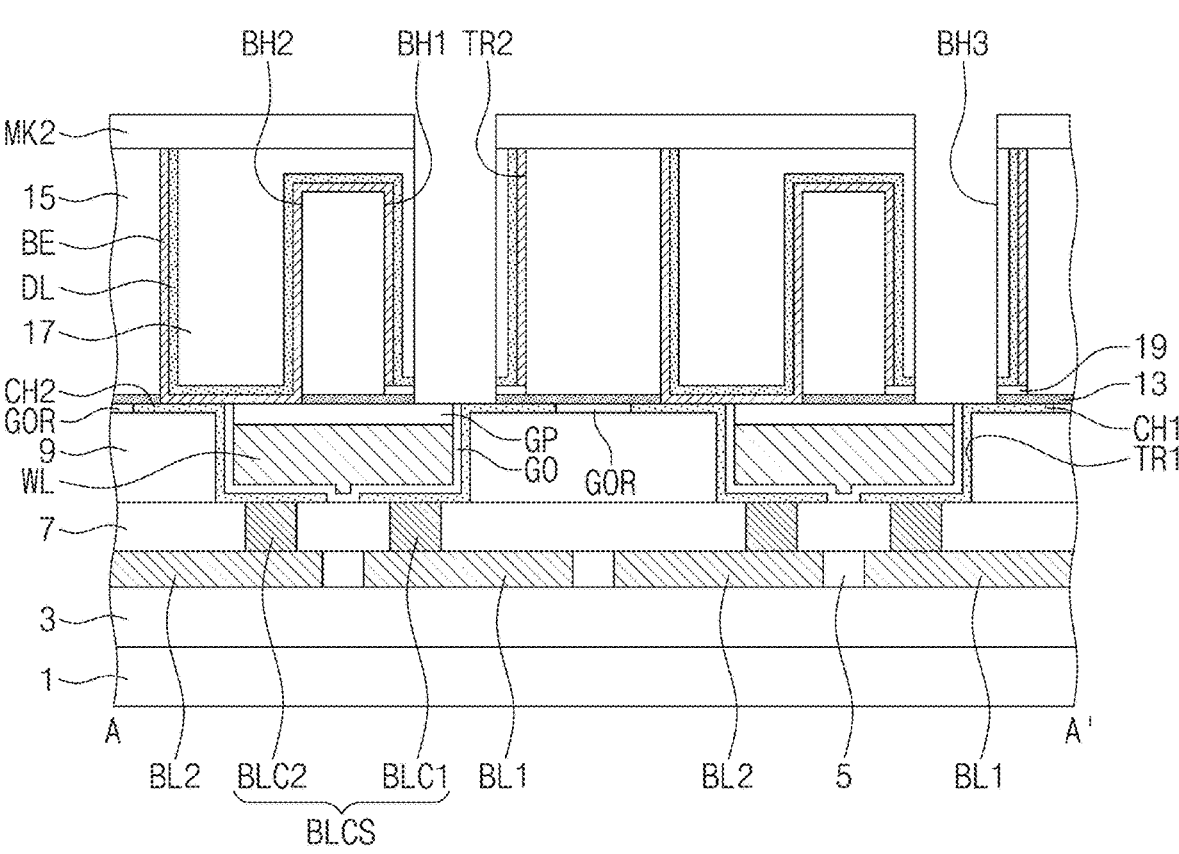

Referring to FIGS. 18A and 18B, an empty space ES may be formed by removing a portion of the bottom electrode BE, which is exposed through an inner side surface of the third electrode hole BH3. Next, the insulating gapfill layer 19 may be conformally formed to fill the empty space ES, and then, a wet etching process may be performed on the insulating gapfill layer 19 to leave the insulating gapfill layer 19 in the empty space ES.

Figure 19A:
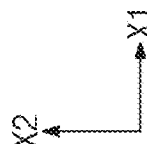
Figure 19B:
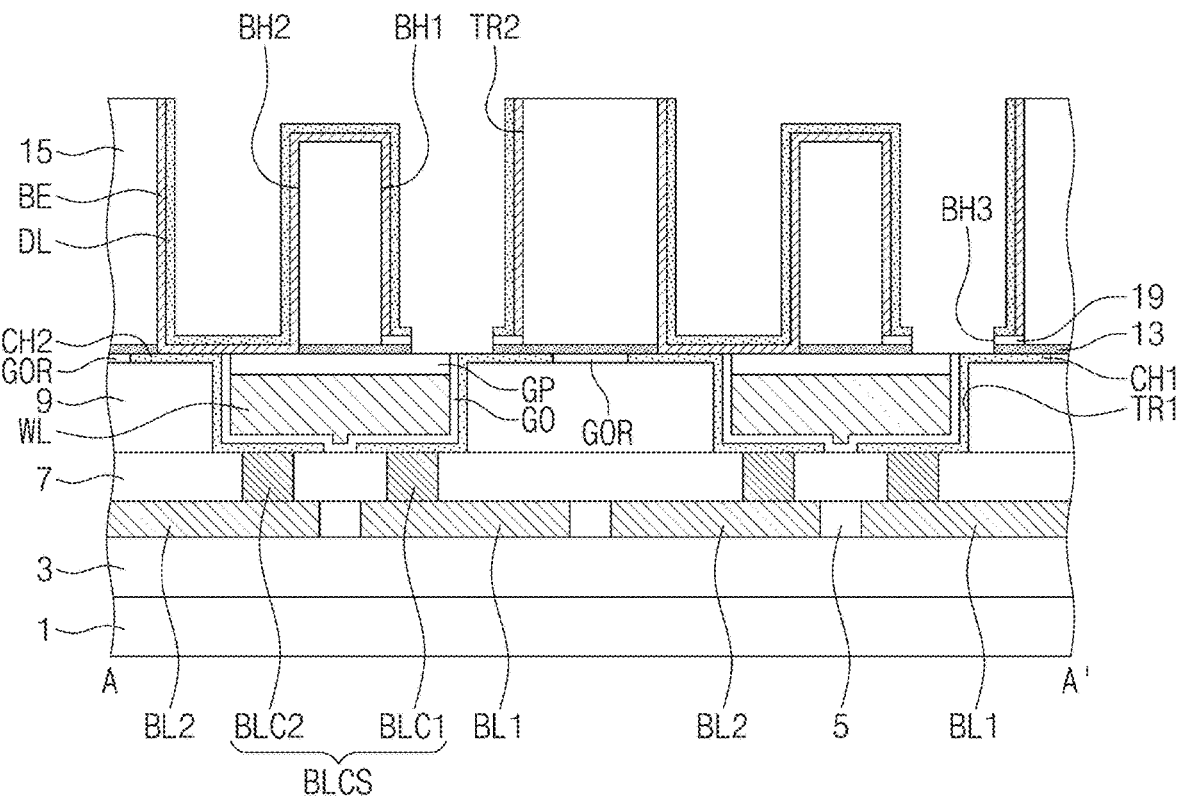
Figure 19C:
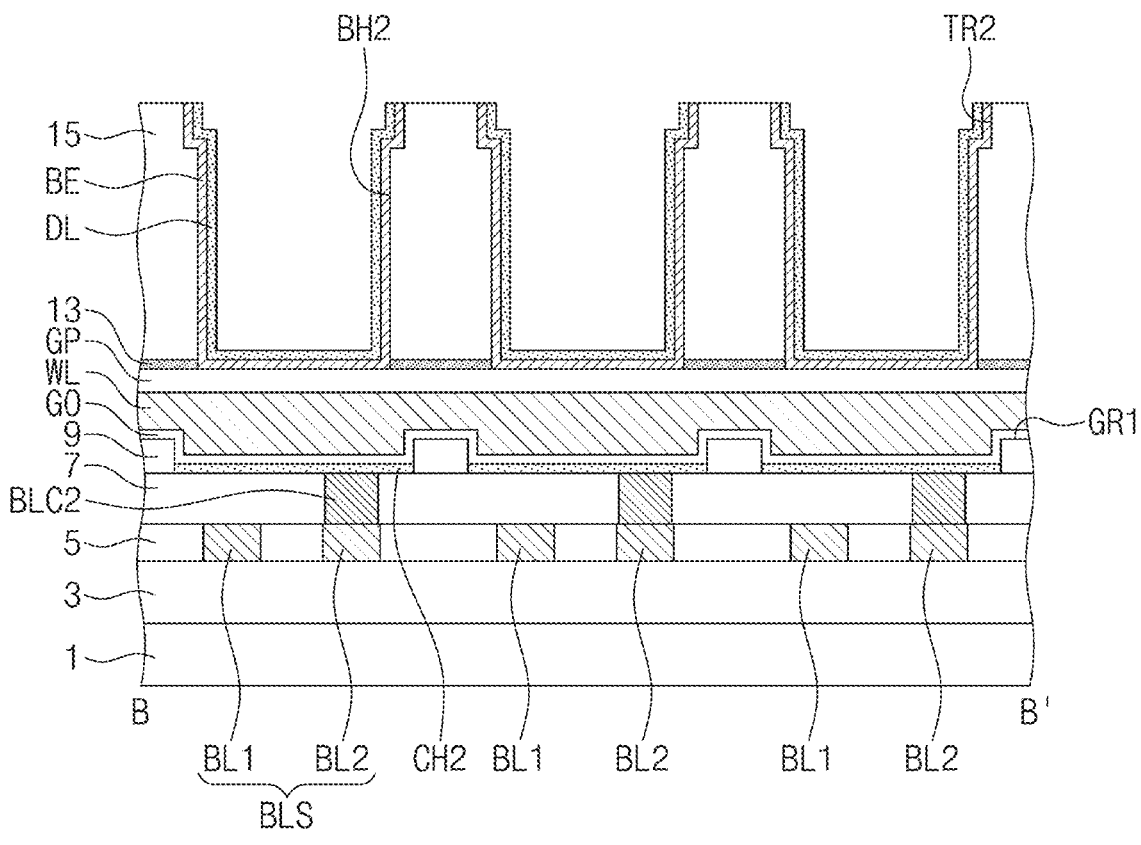

Referring to FIGS. 19A to 19C, the second mask pattern MK2 and the third sacrificial layer 17 may be removed to expose the dielectric layer DL and the fifth interlayer insulating layer 15. Here, the first channel pattern CH1 below the third electrode hole BH3 may be exposed.

Referring back to FIGS. 1A to 1C, a top electrode layer may be conformally formed on the substrate 1, and a gapfill electrode layer may be formed to fill the second trench TR2 and the first and second electrode holes BH1 and BH2. A CMP process may be performed on the gapfill electrode layer and the top electrode layer to form the top electrode TE and the gapfill electrode pattern PE. As a result, the semiconductor memory device 100 described with reference to FIGS. 1A to 1C may be fabricated.

In the fabrication method according to an embodiment of inventive concepts, since the first and second bit lines BL1 and BL2 are formed at the same time and the word line WL is shared by two transistors, it may be possible to simplify a process of fabricating a 2T-1C DRAM device. In addition, since the bottom electrode BE is disposed in the first and second electrode holes BH1 and BH2, it may be possible to achieve a large capacitance, even when the capacitor CAP has a reduced height. Accordingly, it may be possible to reduce the difficulty in forming the capacitor CAP. Furthermore, it may be easy to connect interconnection lines to the capacitor CAP, the word line WL, and the bit lines BL1 and BL2.

Figure 20A:
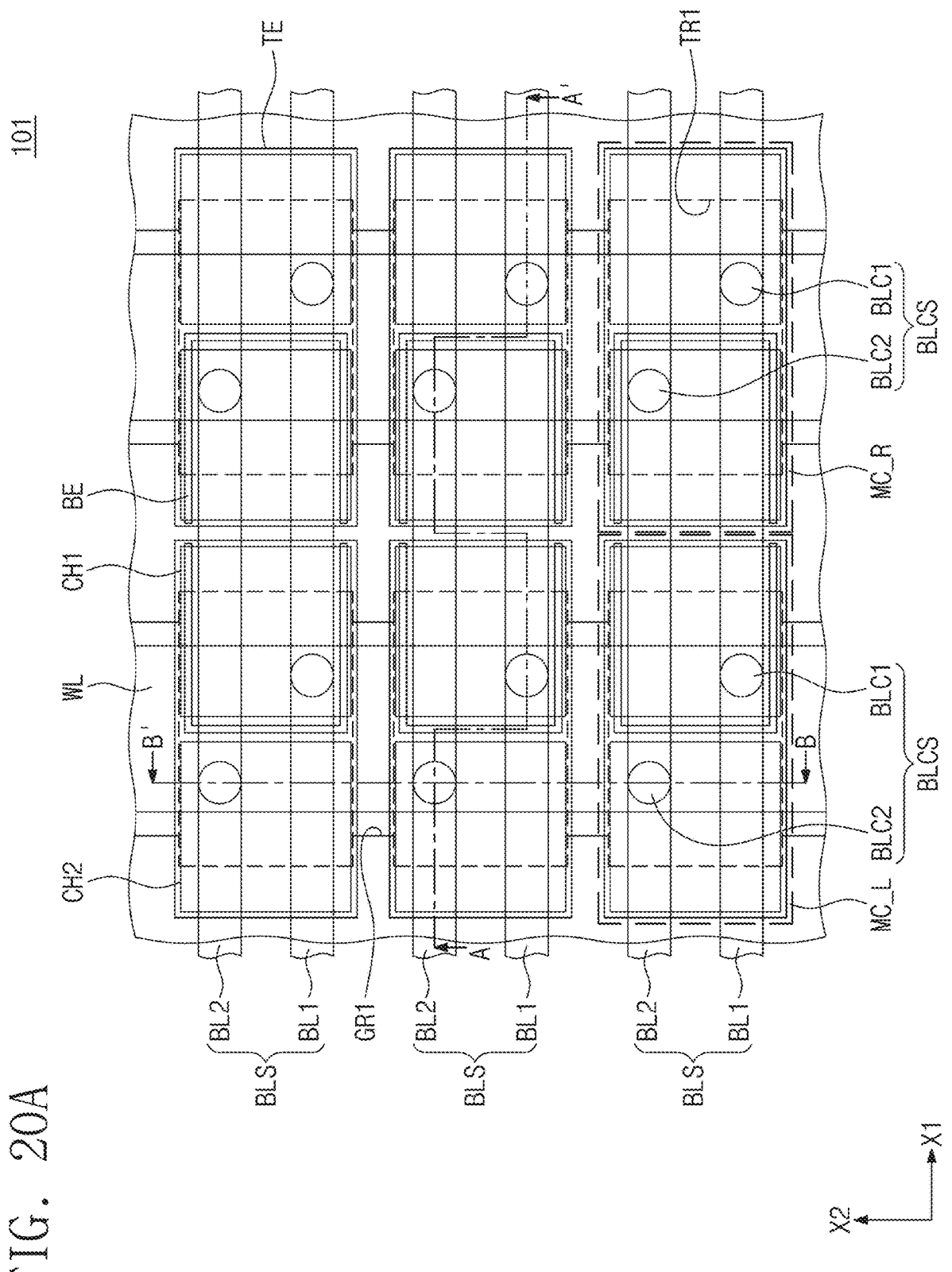
FIG. 20A is a plan view illustrating a semiconductor memory device according to an embodiment of inventive concepts.
Figure 20B:
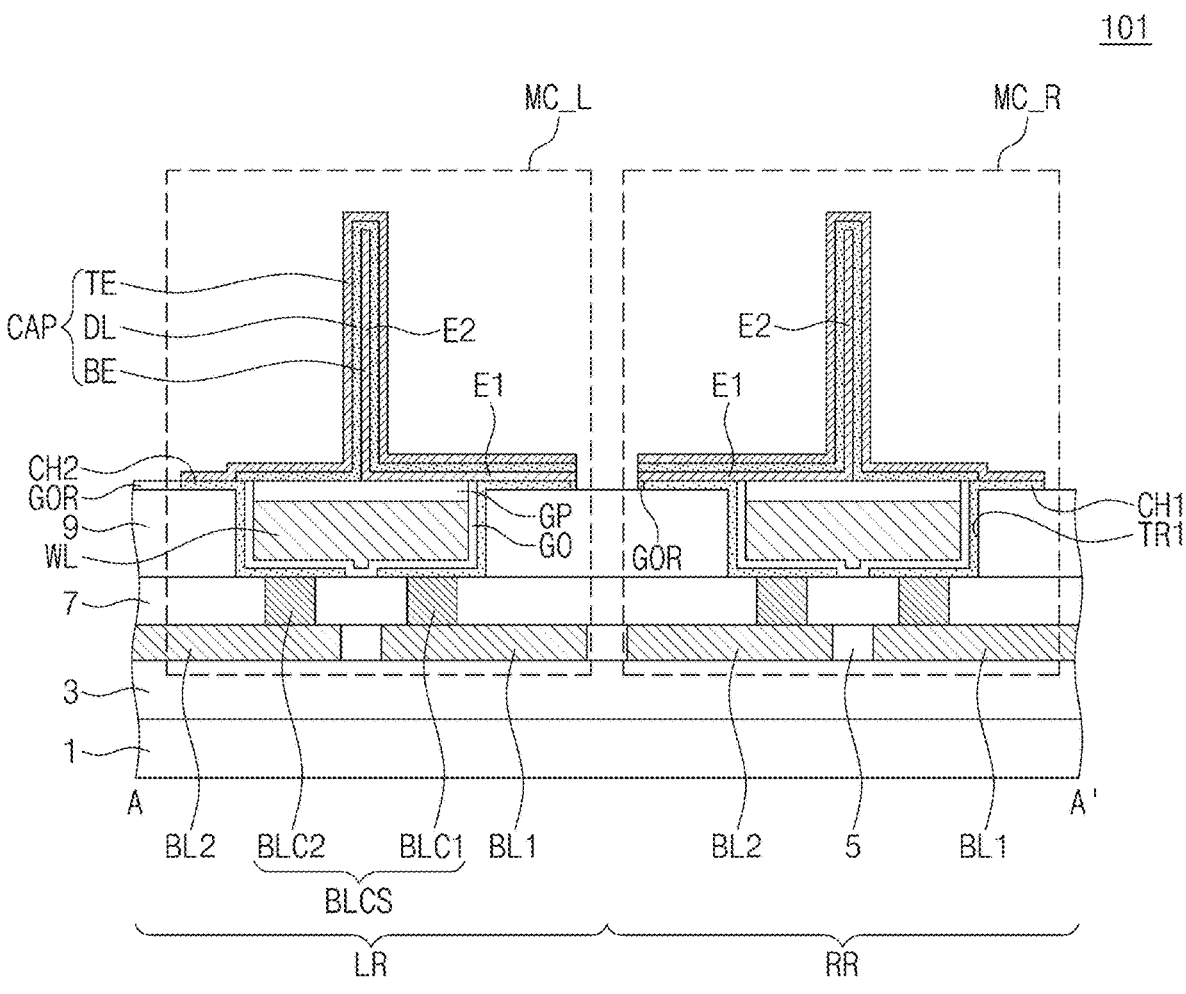
FIG. 20B is a sectional view taken along a line A-A' of FIG. 20A.
Figure 20C:
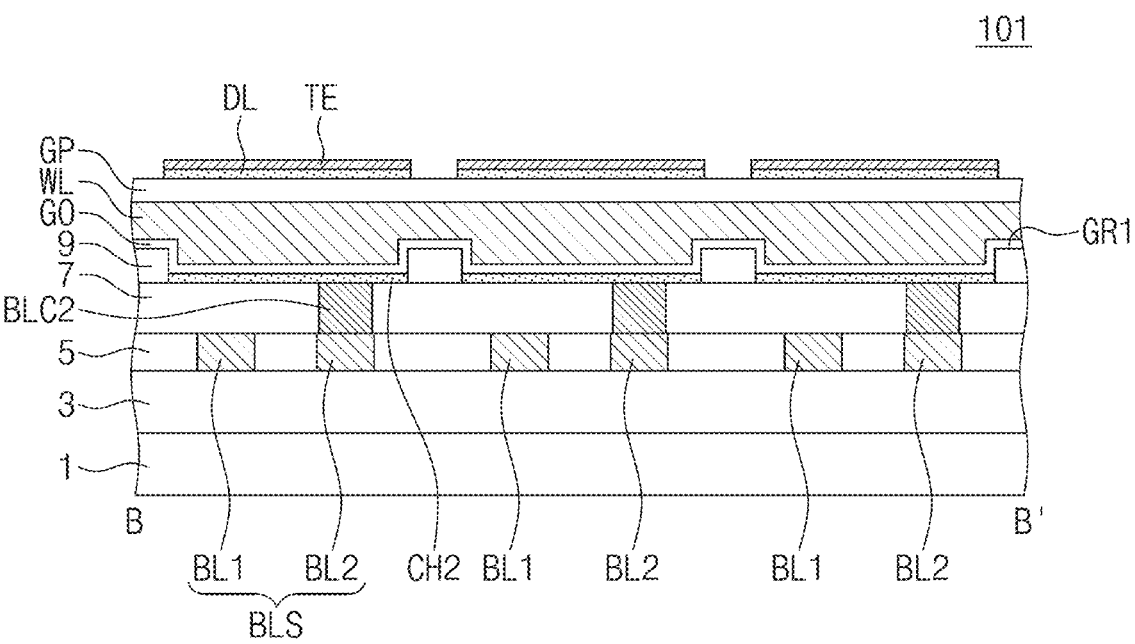
FIG. 20C is a sectional view taken along a line B-B' of FIG. 20A.
Figure 20D:
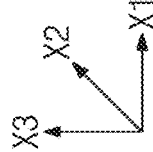
FIG. 20D is a perspective view illustrating a unit memory cell of FIGS. 20A and 20B.

FIG. 20A is a plan view illustrating a semiconductor memory device according to an embodiment of inventive concepts. FIG. 20B is a sectional view taken along a line A-A' of FIG. 20A. FIG. 20C is a sectional view taken along a line B-B' of FIG. 20A. FIG. 20D is a perspective view illustrating a unit memory cell of FIGS. 20A and 20B.

Referring to FIGS. 20A to 20D, in a semiconductor memory device 101 according to the present embodiment, a shape of the capacitor CAP may be different from that of the capacitor CAP of the semiconductor memory device 100 of FIGS. 1A to 2. The semiconductor memory device 101 may include a plurality of memory cells MC_L and MC_R, which are two-dimensionally arranged in the first and second directions X1 and X2. The substrate 1 may include a left region LR and a right region RR, which are adjacent to each other. A left memory cell MC_L may be disposed on the left region LR, and a right memory cell MC_R may be disposed on the right region RR.

The capacitor CAP of the left memory cell MC_L and the capacitor CAP of the right memory cell MC_R may have mirror symmetric shapes with respect to each other. In the left memory cell MC_L, the bottom electrode BE may be in contact with the first channel pattern CH1, and the top electrode TE may be in contact with the second channel pattern CH2. In the right memory cell MC_R, the bottom electrode BE may be in contact with the second channel pattern CH2, and the top electrode TE may be in contact with the first channel pattern CH1. The bottom electrode BE may have a letter 'L'-shaped section. That is, the bottom electrode BE may have a first electrode portion E1, which is in contact with the first or second channel pattern CH1 or CH2, and a second electrode portion E2, which extends upward from an end of the first electrode portion E1. The top electrode TE may be provided to conformally cover a top surface of the first electrode portion E1 and both side surfaces of the second electrode portion E2. The capacitor CAP according to the present embodiment may have a semi-one-cylinder-stacked (semi-OCS) structure. Except for this difference, the semiconductor memory device 101 according to the present embodiment may be configured to have substantially the same features as that described with reference to FIGS. 1A to 3.

FIG. 21A to 26A are plan views sequentially illustrating a process of fabricating a semiconductor memory device having the planar structure of FIG. 20A. FIG. 21B to 26B are sectional views sequentially illustrating a process of fabricating a semiconductor memory device having the sectional structure of FIG. 20B. FIGS. 21C, 25C, and 26C are sectional views sequentially illustrating a process of fabricating a semiconductor memory device having the sectional structure of FIG. 20C. Each of sections, which are taken along lines B-B' of FIGS. 22A and 23A, may have the same shape as that shown in FIG. 21C. A section, which is taken along a line B-B' of FIG. 24A, may have the same shape as that shown in FIG. 12C.

Figure 21A:
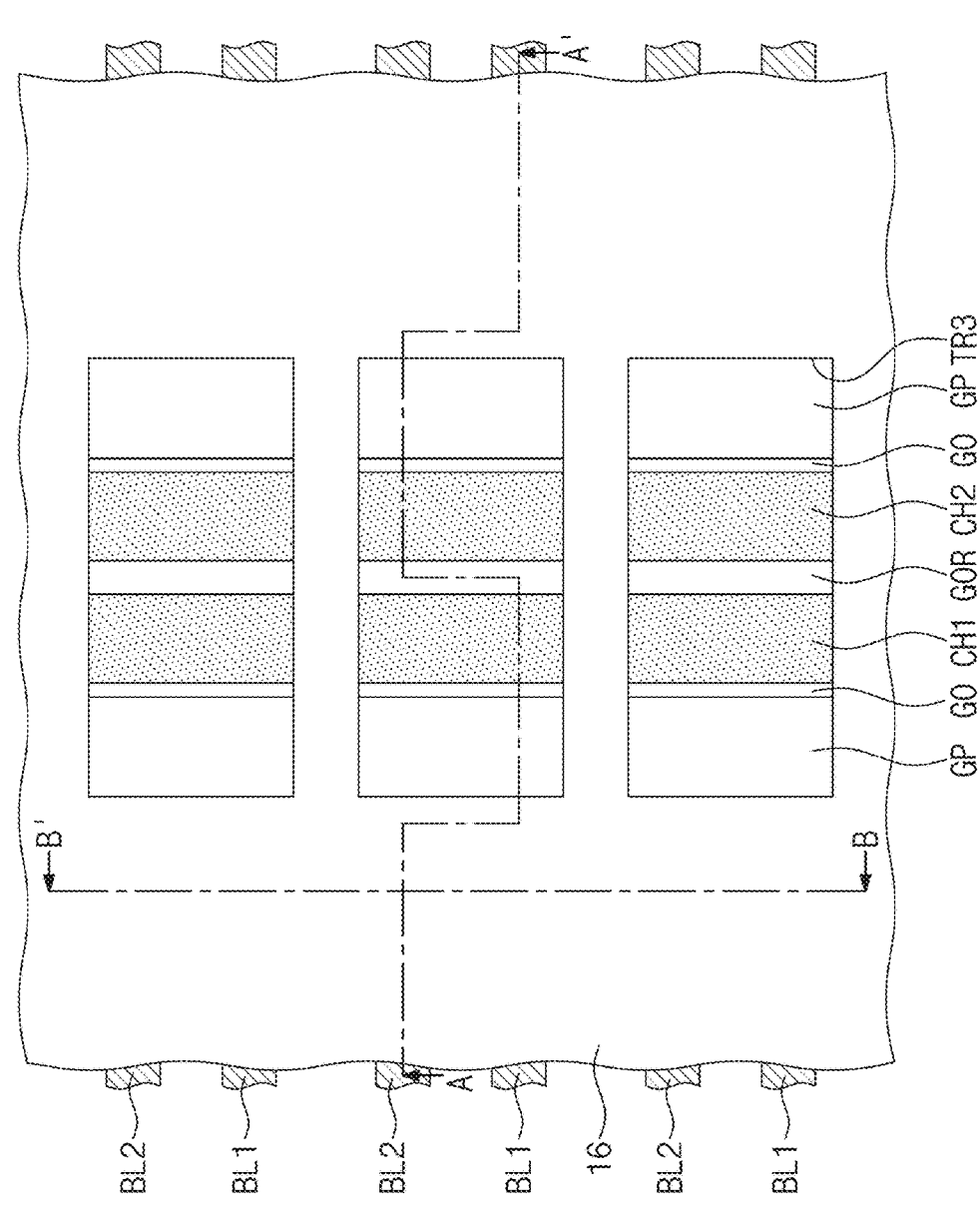
Figure 21A:
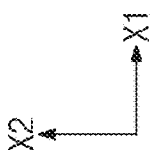
Figure 21B:
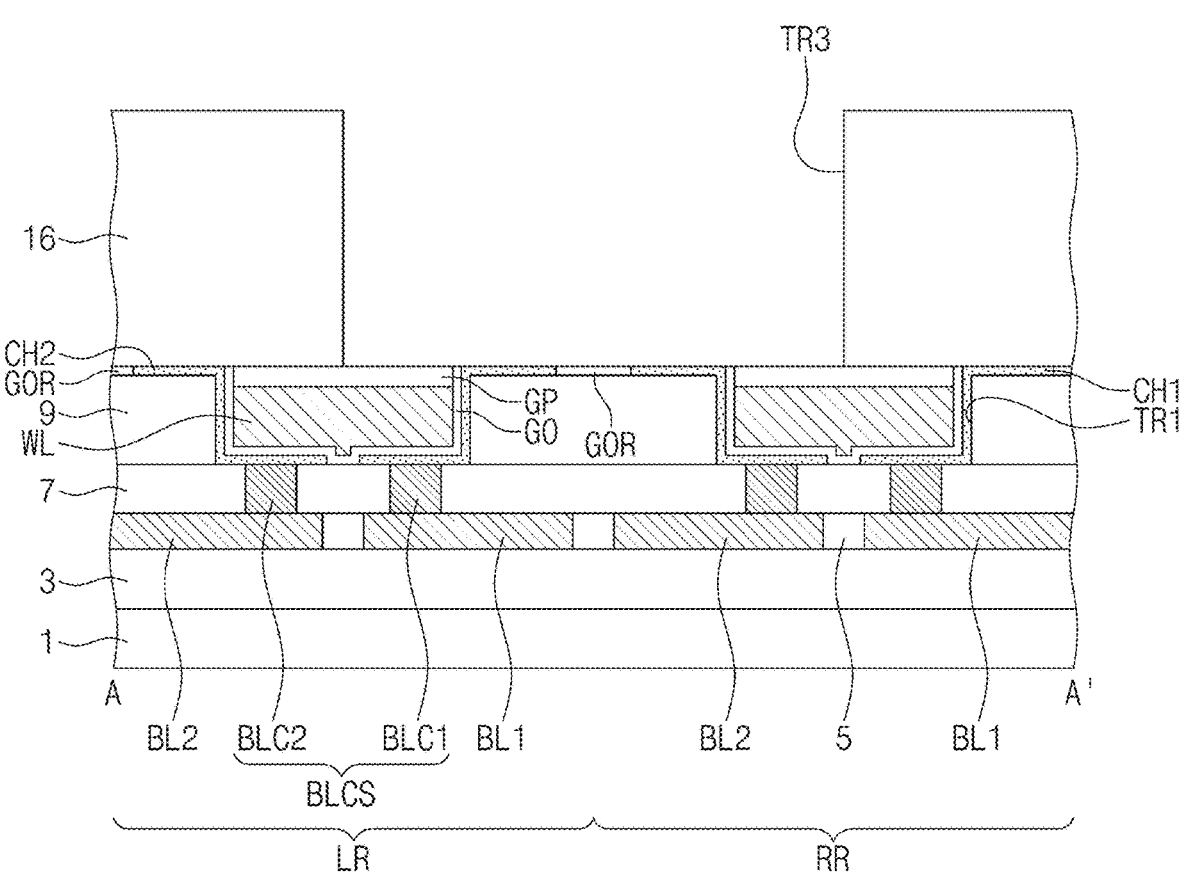
Figure 21C:
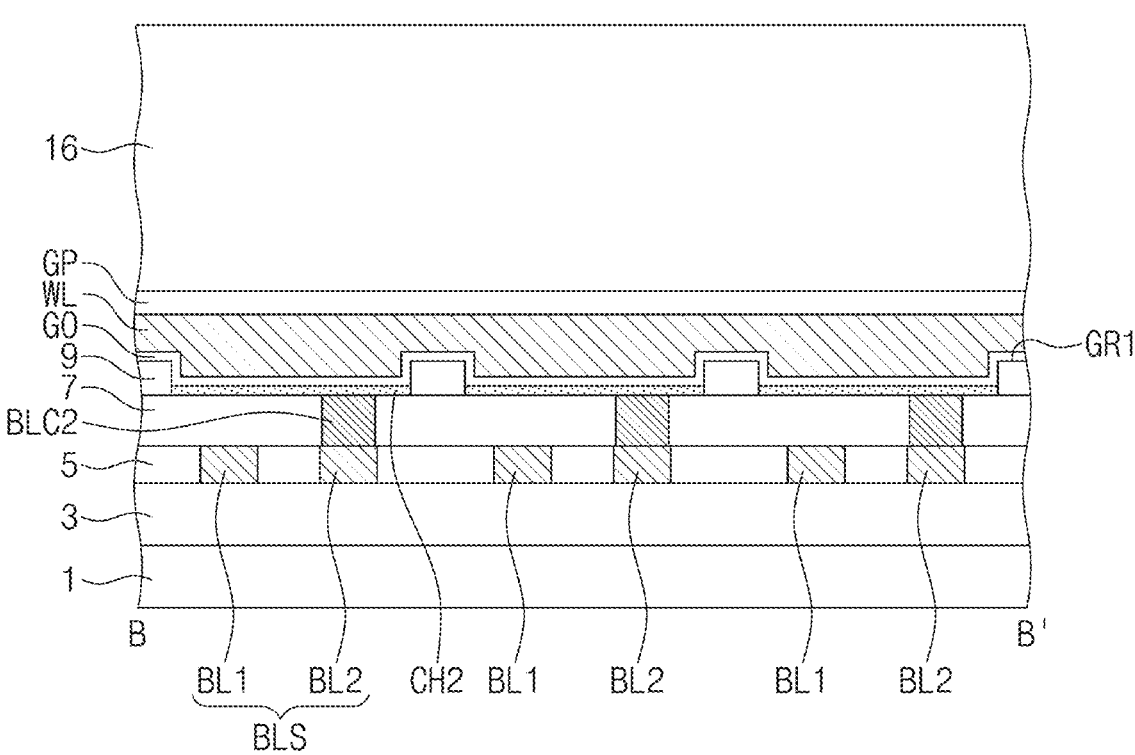
FIGS. 21C, 25C, and 26C are sectional views sequentially illustrating a process of fabricating a semiconductor memory device having the sectional structure of FIG. 20C.

Referring to FIGS. 21A to 21C, a mold layer 16 may be formed on the structure shown in FIGS. 12A to 12C (e.g., on the first and second channel patterns CH1 and CH2 and the word line capping layer GP). In an embodiment, the mold layer 16 may be formed of or include at least one of silicon oxide, silicon nitride, silicon oxynitride, polysilicon, or silicon germanium. The mold layer 16 may be etched to form a third trench TR3. The third trench TR3 may be formed to expose the first channel pattern CH1 on the left region LR and the second channel pattern CH2 on the right region RR. In addition, the word line capping layer GP, which is placed near the first and second channel patterns CH1 and CH2, and the residual gate insulating layer GOR, which is placed between the first and second channel patterns CH1 and CH2, may also be exposed.

Figure 22A:
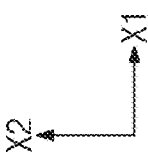
Figure 22B:
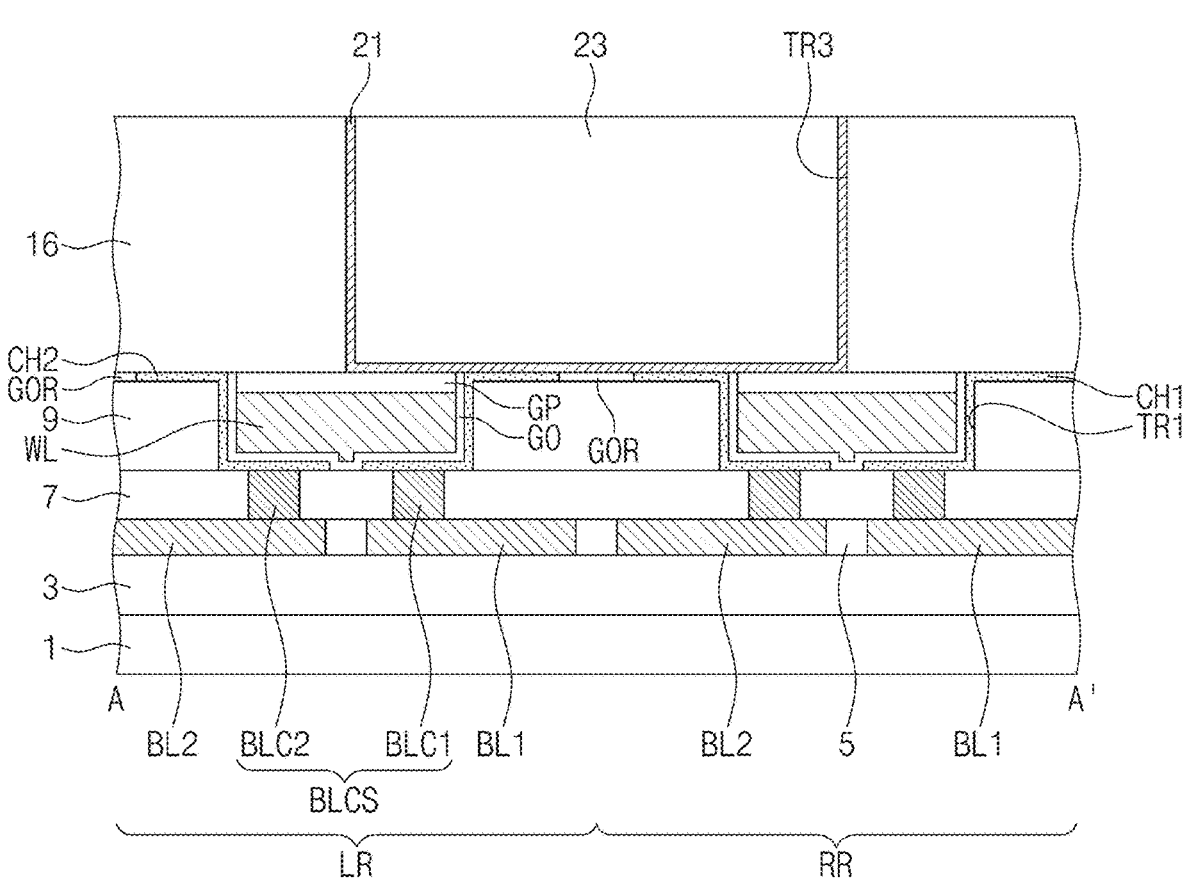

Referring to FIGS. 22A and 22B, a bottom electrode layer 21 may be formed to conformally cover an inner side surface and a bottom surface of the third trench TR3. Next, a fourth sacrificial pattern 23 may be formed to fill the third trench TR3. In an embodiment, the fourth sacrificial pattern 23 may be formed of or include at least one of SOH materials or silicon nitride.

Figure 23A:
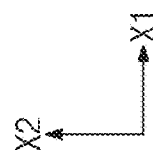
Figure 23B:
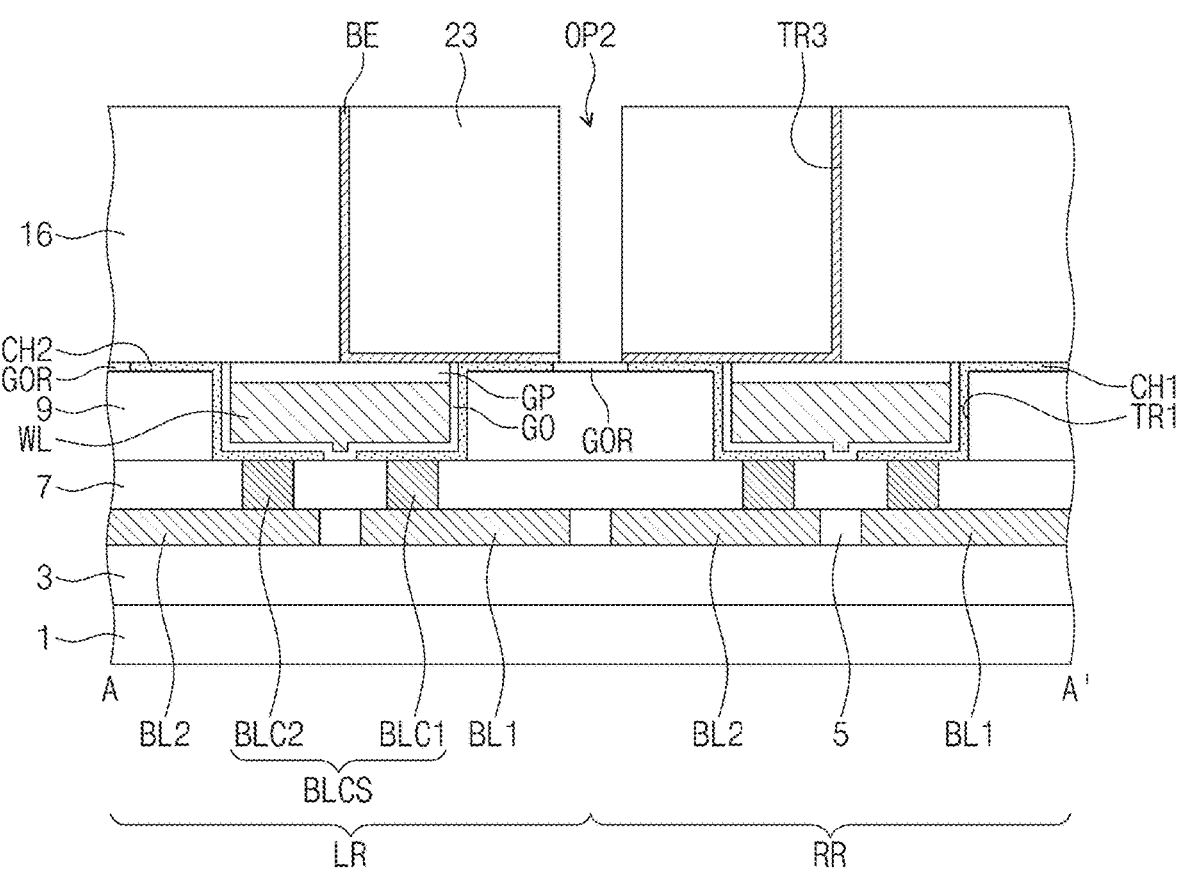

Referring to FIGS. 23A and 23B, the fourth sacrificial pattern 23, which is placed on a boundary between the left and right regions LR and RR, and the bottom electrode layer 21 thereunder may be etched to form a second opening OP2 exposing the residual gate insulating layer GOR. As a result of the etching of the bottom electrode layer 21, the bottom electrodes BE may be formed.

Figure 24A:
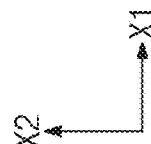
Figure 24B:
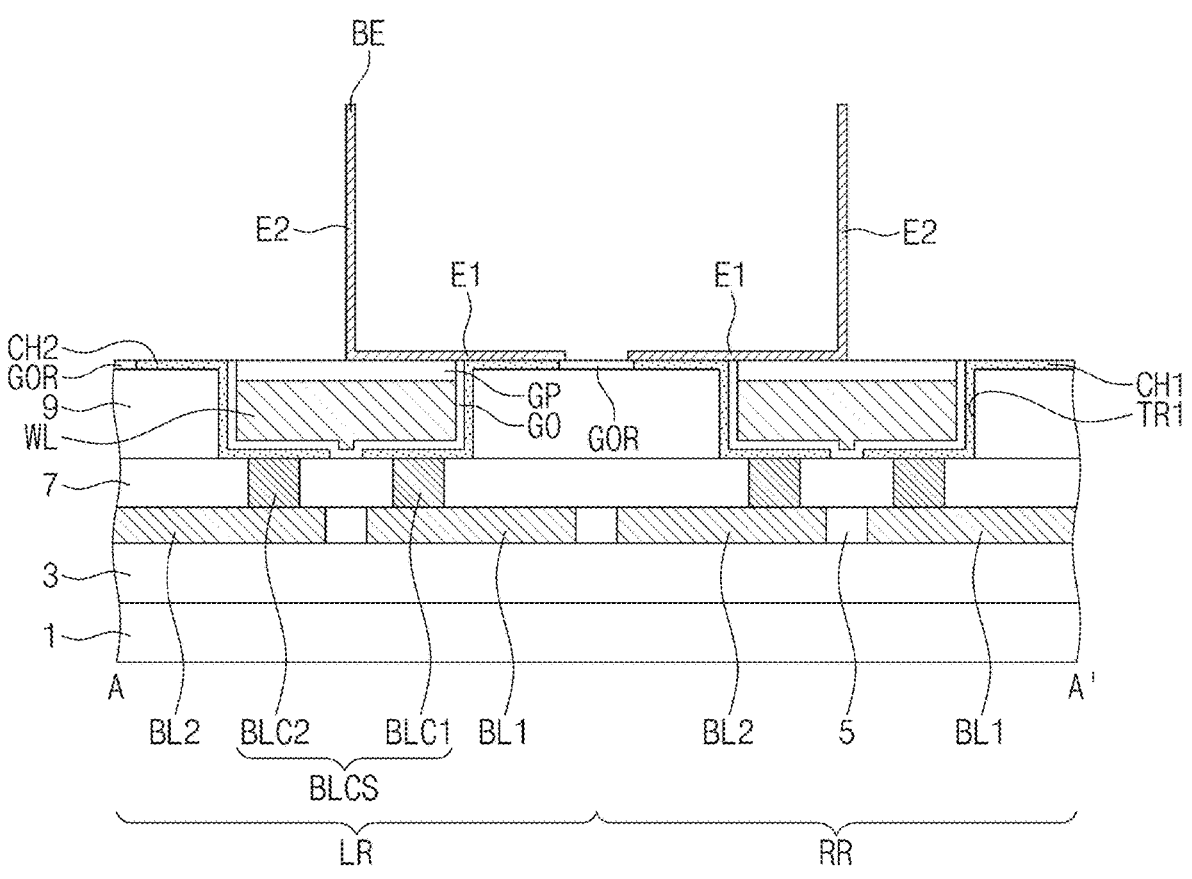

Referring to FIGS. 24A and 24B, the fourth sacrificial pattern 23 and the mold layer 16 may be removed. As a result, the second channel pattern CH2 may be exposed on the left region LR, and the first channel pattern CH1 may be exposed on the right region RR. The bottom electrode BE may have the first electrode portion E1, which is in contact with the first or second channel pattern CH1 or CH2, and the second electrode portion E2, which extends upward from an end of the first electrode portion E1.

Figure 25A:
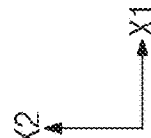
Figure 25B:
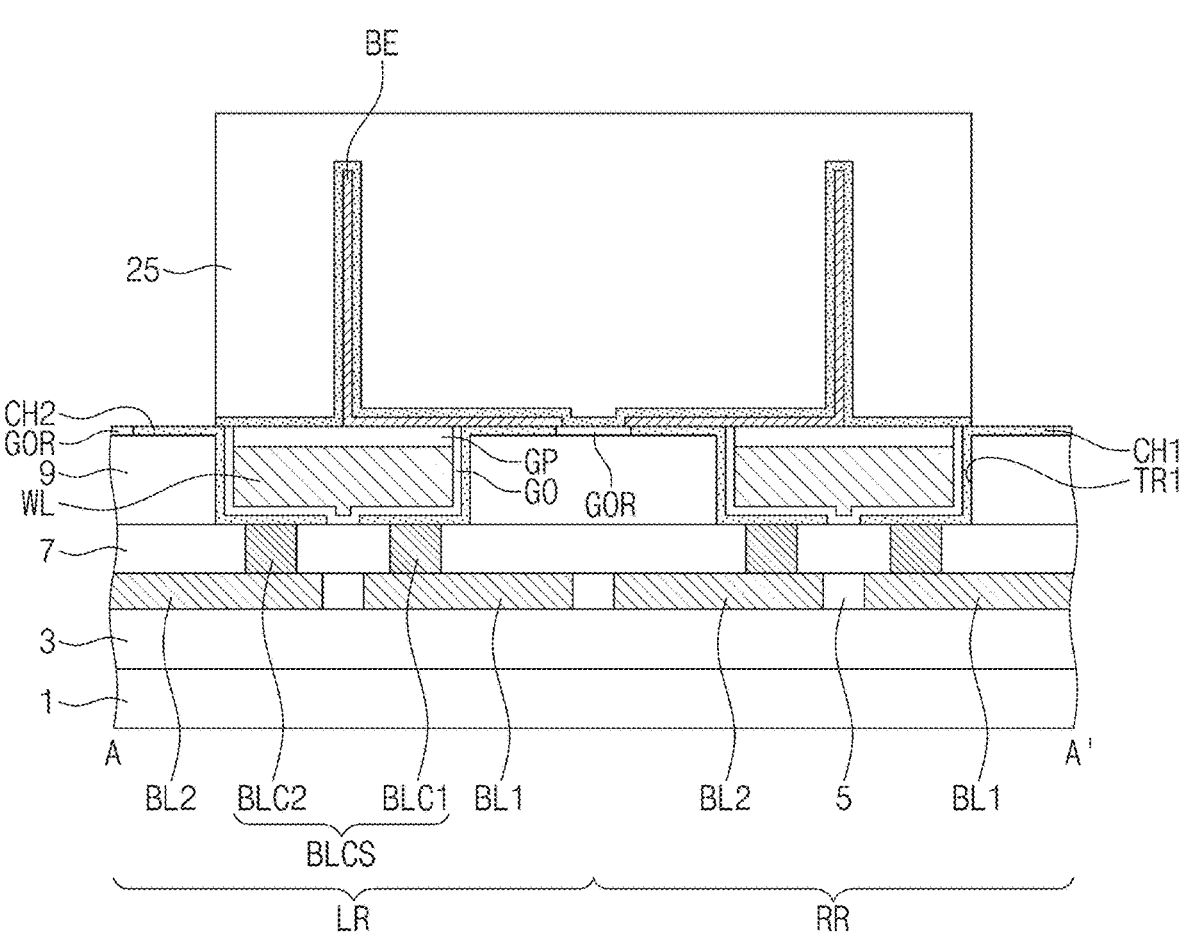
Figure 25C:
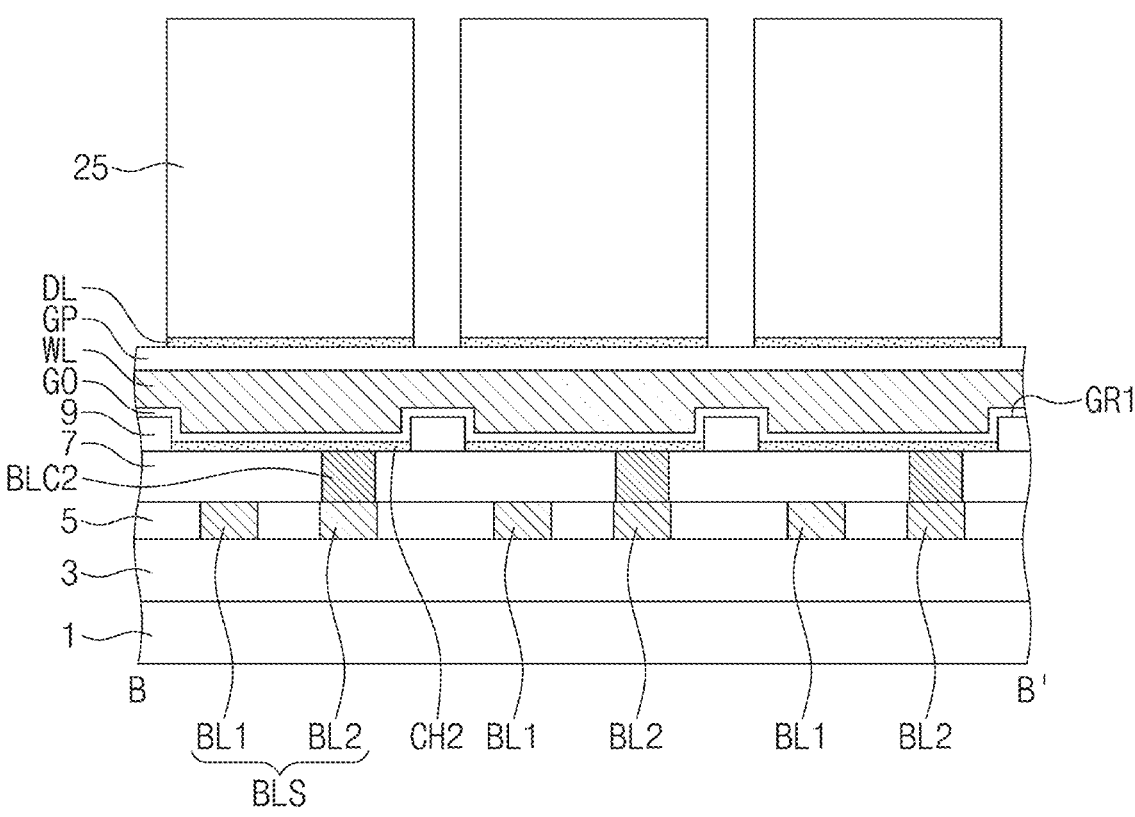

Referring to FIGS. 25A to 25C, the dielectric layer DL may be formed to conformally cover the structure provided with the bottom electrodes BE. Thereafter, a mask layer may be formed on the dielectric layer DL and may be etched to form a third mask pattern 25. In an embodiment, the third mask pattern 25 may be formed of or include at least one of SOH materials and silicon oxide. The dielectric layer DL may be etched using the third mask pattern 25 as an etch mask to expose the second channel pattern CH2 on the left region LR and the first channel pattern CH1 on the right region RR, respectively.

Figure 26A:
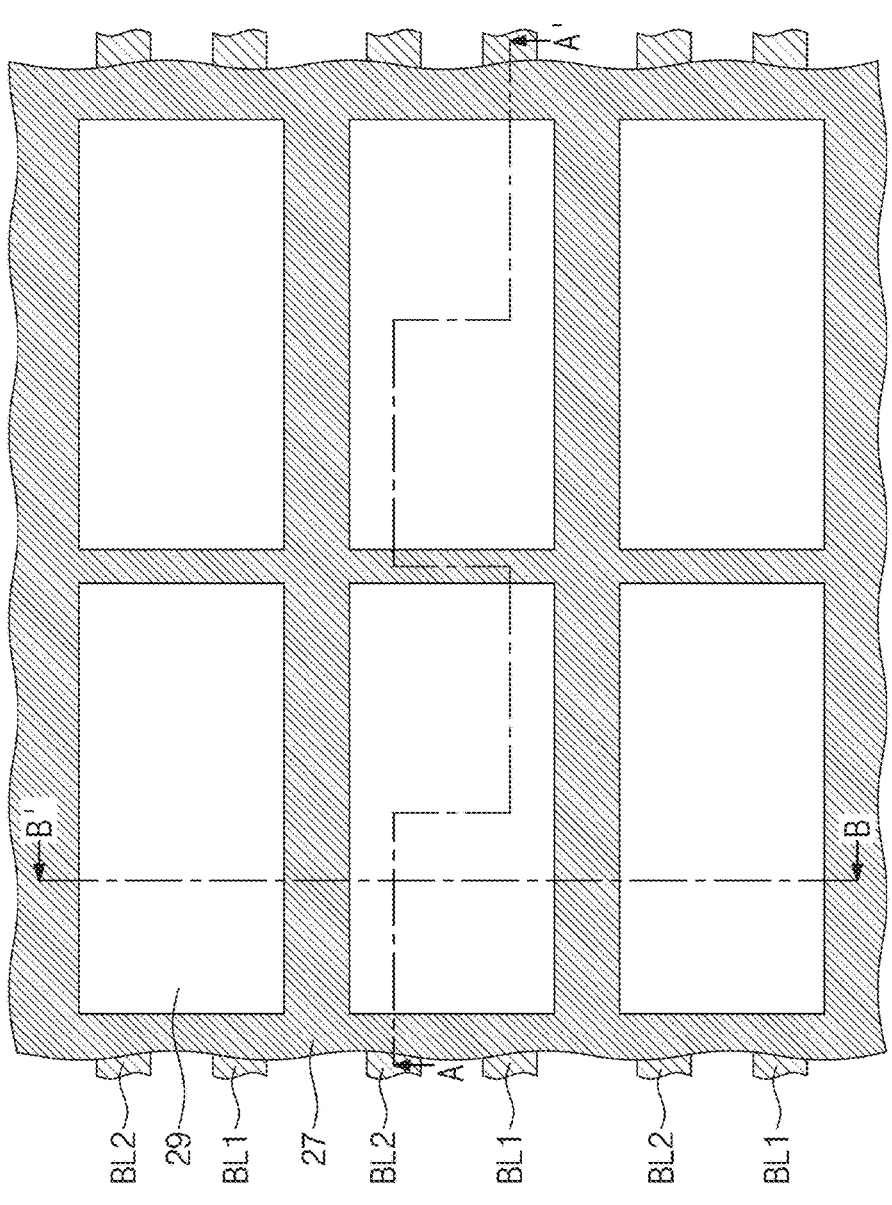
Figure 26A:
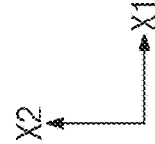
Figure 26B:
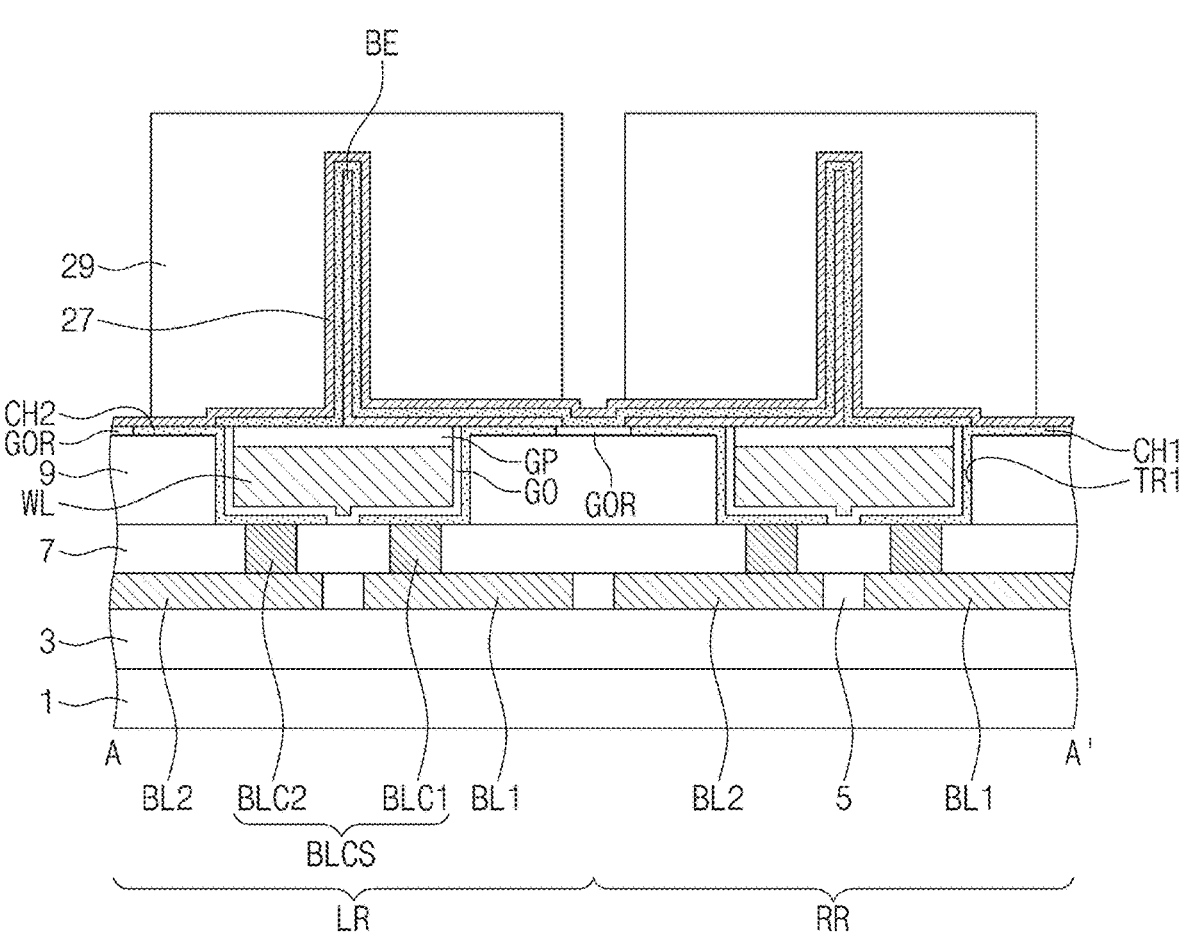
Figure 26C:
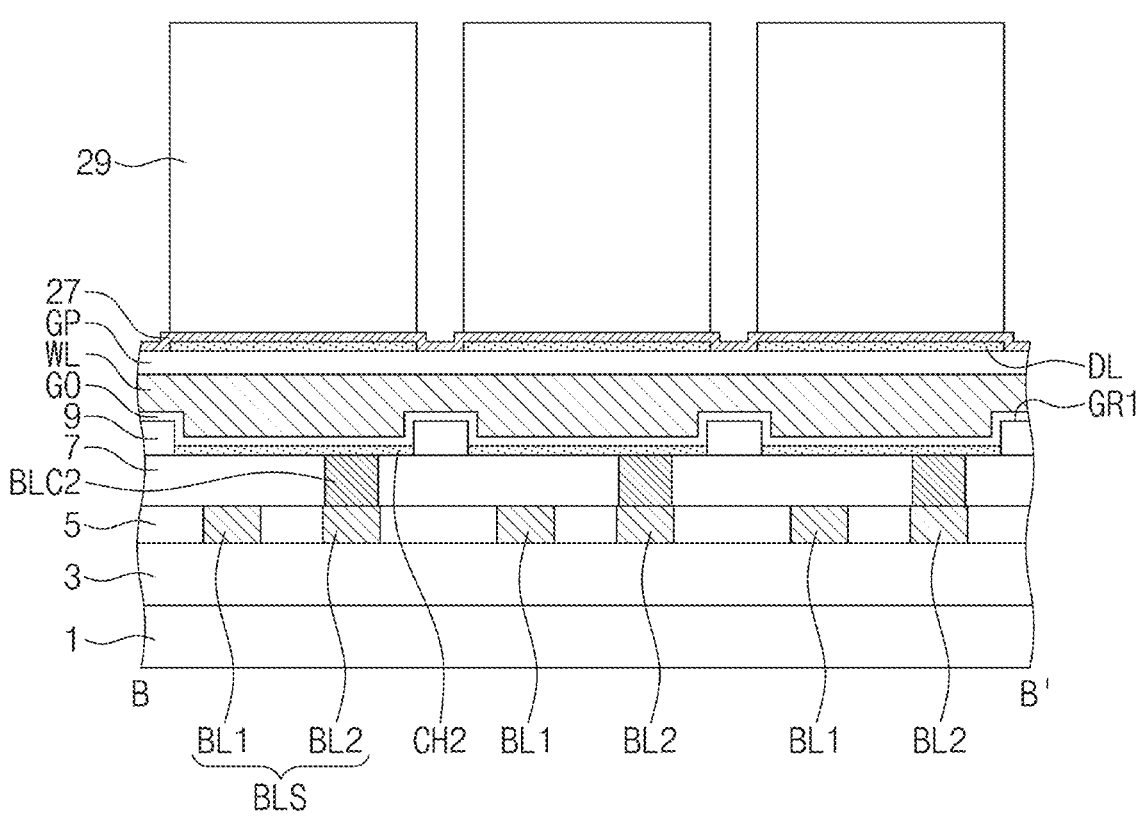

Referring to FIGS. 26A to 26C, the third mask pattern 25 may be removed to expose the dielectric layer DL. Thereafter, a top electrode layer 27 may be conformally formed on the substrate 1. Fourth mask patterns 29 may be formed on the top electrode layer 27. The fourth mask patterns 29 may be respectively formed on the left and right regions LR and RR.

Referring back to FIGS. 20A to 20D, the top electrodes TE may be formed by etching the top electrode layer 27 using the fourth mask patterns 29 as an etch mask. Here, the dielectric layer DL between the left and right regions LR and RR may be removed. Thus, the semiconductor memory device 101 of FIGS. 20A to 20D may be formed.

Figure 27:
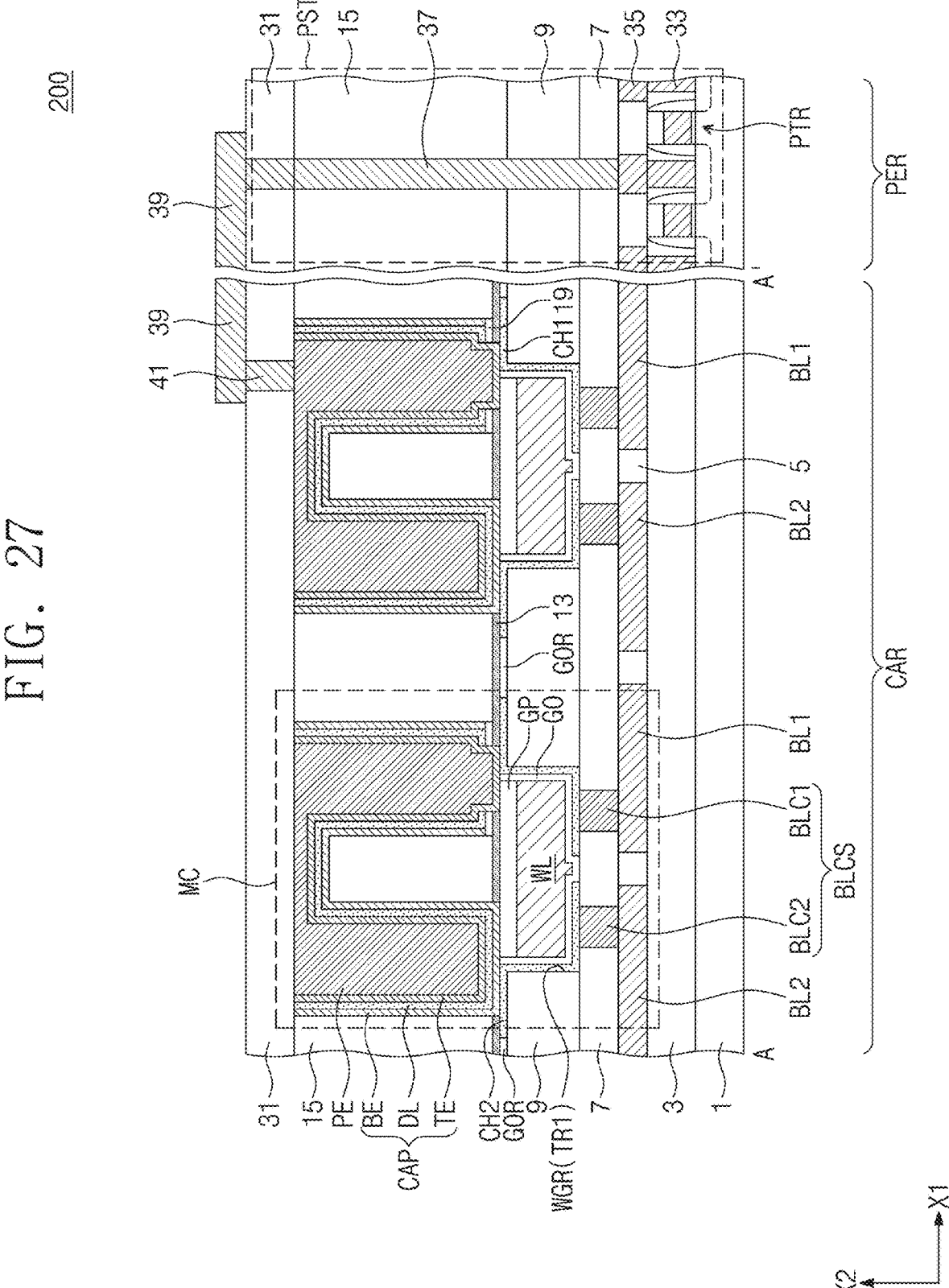
FIG. 27 is a sectional view illustrating a semiconductor memory device according to an embodiment of inventive concepts.

FIG. 27 is a sectional view illustrating a semiconductor memory device according to an embodiment of inventive concepts.

Referring to FIG. 27, in a semiconductor memory device 200 according to the present embodiment, the substrate 1 may include a cell array region CAR and a peripheral circuit region PER. The memory cells MC described with reference to FIGS. 1A to 3 may be disposed on the cell array region CAR. Alternatively, the memory cells MC_L and MC_R described with reference to FIGS. 20A to 20D may be disposed on the cell array region CAR.

Peripheral transistors PTR may be disposed on the peripheral circuit region PER of the substrate 1. The peripheral transistors PTR may constitute a sub-word line driver circuit, a sensing amplifier circuit, a row decoder circuit, or a column decoder circuit. The peripheral transistors PTR may be covered with first to sixth interlayer insulating layers 3, 5, 7, 9, 15, and 31 which are sequentially stacked. First peripheral contacts 33 may be provided to penetrate the first interlayer insulating layer 3. First peripheral pads 35 may be located at the same level as the first and second bit lines BL1 and BL2 and may be formed of or include the same material as the first and second bit lines BL1 and BL2. A second peripheral contact 37 may be provided to penetrate the third to sixth interlayer insulating layers 7, 9, 15, and 31. The peripheral transistors PTR, the first peripheral contacts 33, the first peripheral pads 35, and the second peripheral contact 37 may constitute a peripheral circuit structure PST. A peripheral interconnection line 39 may be provided on the sixth interlayer insulating layer 31 and may be used to connect the gapfill electrode pattern PE to the peripheral circuit structure PST, in conjunction with the second peripheral contact 37 and a cell contact 41. Except for the afore-described differences, the semiconductor memory device may have substantially the same or similar structural features as those in the previous embodiments.

Figure 28:
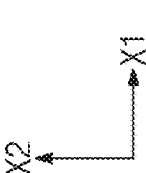
FIG. 28 is a sectional view illustrating a semiconductor memory device according to an embodiment of inventive concepts.

FIG. 28 is a sectional view illustrating a semiconductor memory device according to an embodiment of inventive concepts.

Referring to FIG. 28, in a semiconductor memory device 201 according to the present embodiment, a cell array structure CST may be disposed on the peripheral circuit structure PST. For example, the peripheral transistors PTR may be disposed on the substrate 1. The peripheral transistors PTR may be covered with first to third peripheral interlayer insulating layers 51, 53, and 55, which are sequentially stacked. The first peripheral contacts 33, the first peripheral pads 35, and the second peripheral contact 37 may be disposed in the first to third peripheral interlayer insulating layers 51, 53, and 55, respectively.

The cell array structure CST may include the memory cells MC described with reference to FIGS. 1A to 3. A bottom surface of the first interlayer insulating layer 3 of the cell array structure CST may be in contact with a top surface of the third peripheral interlayer insulating layer 55. A cell connection contact 47 may be disposed in the first interlayer insulating layer 3 to connect the bit lines BL1 and BL2 to the peripheral circuit structure PST. A peripheral connection pad 43 may be disposed in the third peripheral interlayer insulating layer 55 to be in contact with a top surface of the second peripheral contact 37, and a cell connection pad 45 may be disposed in the first interlayer insulating layer 3 to be in contact with a bottom surface of the cell connection contact 47. The cell connection pad 45 may be in contact with the peripheral connection pad 43. Except for the afore-described differences, the semiconductor memory device may have substantially the same or similar structural features as those in the previous embodiments.

Figure 29:
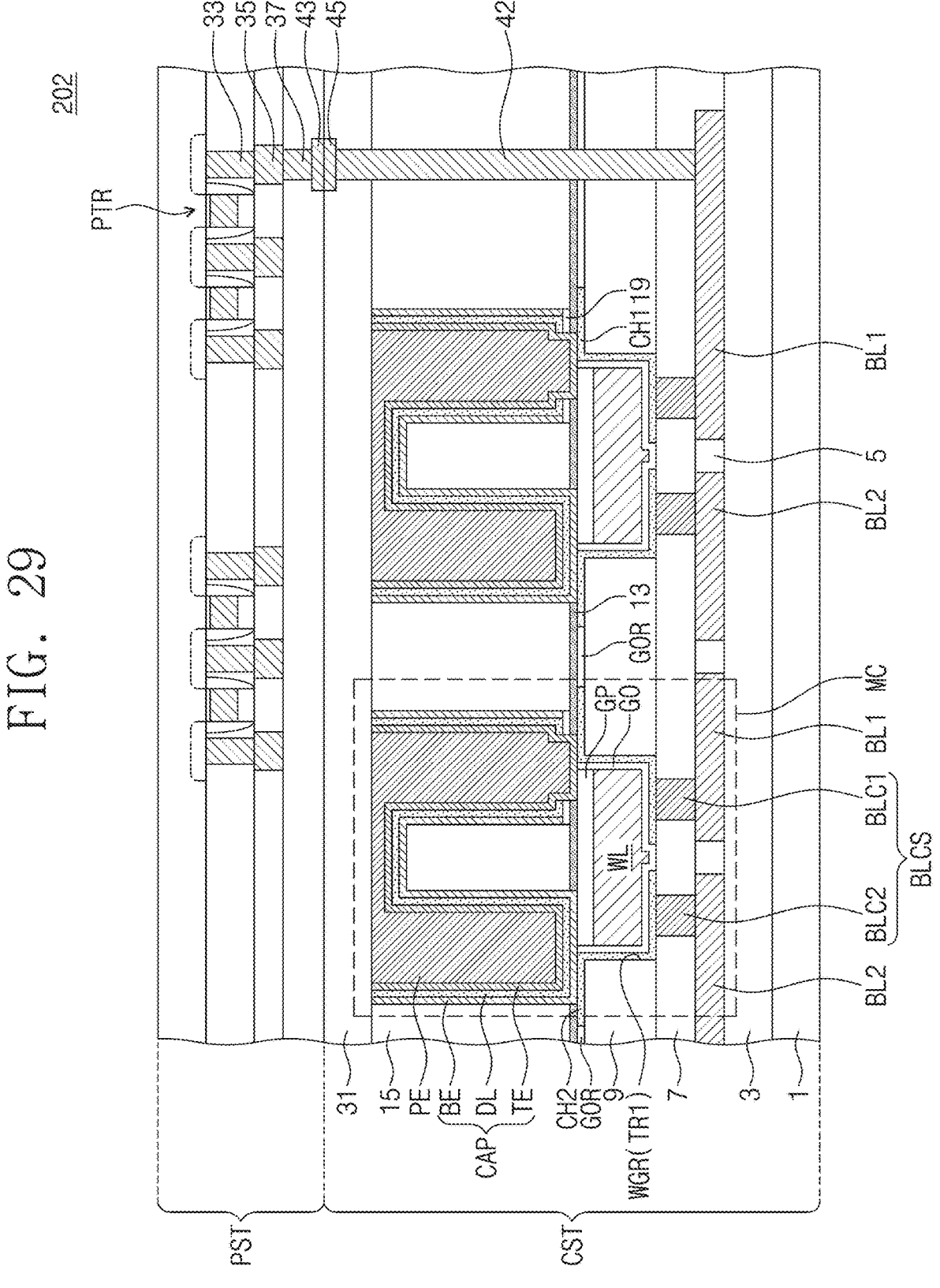
FIG. 29 is a sectional view illustrating a semiconductor memory device according to an embodiment of inventive concepts.

FIG. 29 is a sectional view illustrating a semiconductor memory device according to an embodiment of inventive concepts.

Referring to FIG. 29, in a semiconductor memory device 202 according to the present embodiment, the peripheral circuit structure PST may be disposed on the cell array structure CST. For example, the cell array structure CST may be disposed on the substrate 1, and the peripheral circuit structure PST may be disposed on the cell array structure CST. The cell connection pad 45 may be disposed in the sixth interlayer insulating layer 31 to be in contact with the peripheral connection pad 43. A cell connection contact 42 may be provided to penetrate the third to sixth interlayer insulating layers 7, 9, 15, and 31 and may be connected to one of the bit lines BL1 and BL2. Except for the afore-described differences, the semiconductor memory device may have substantially the same or similar structural features as those in the previous embodiments.

Figure 30:
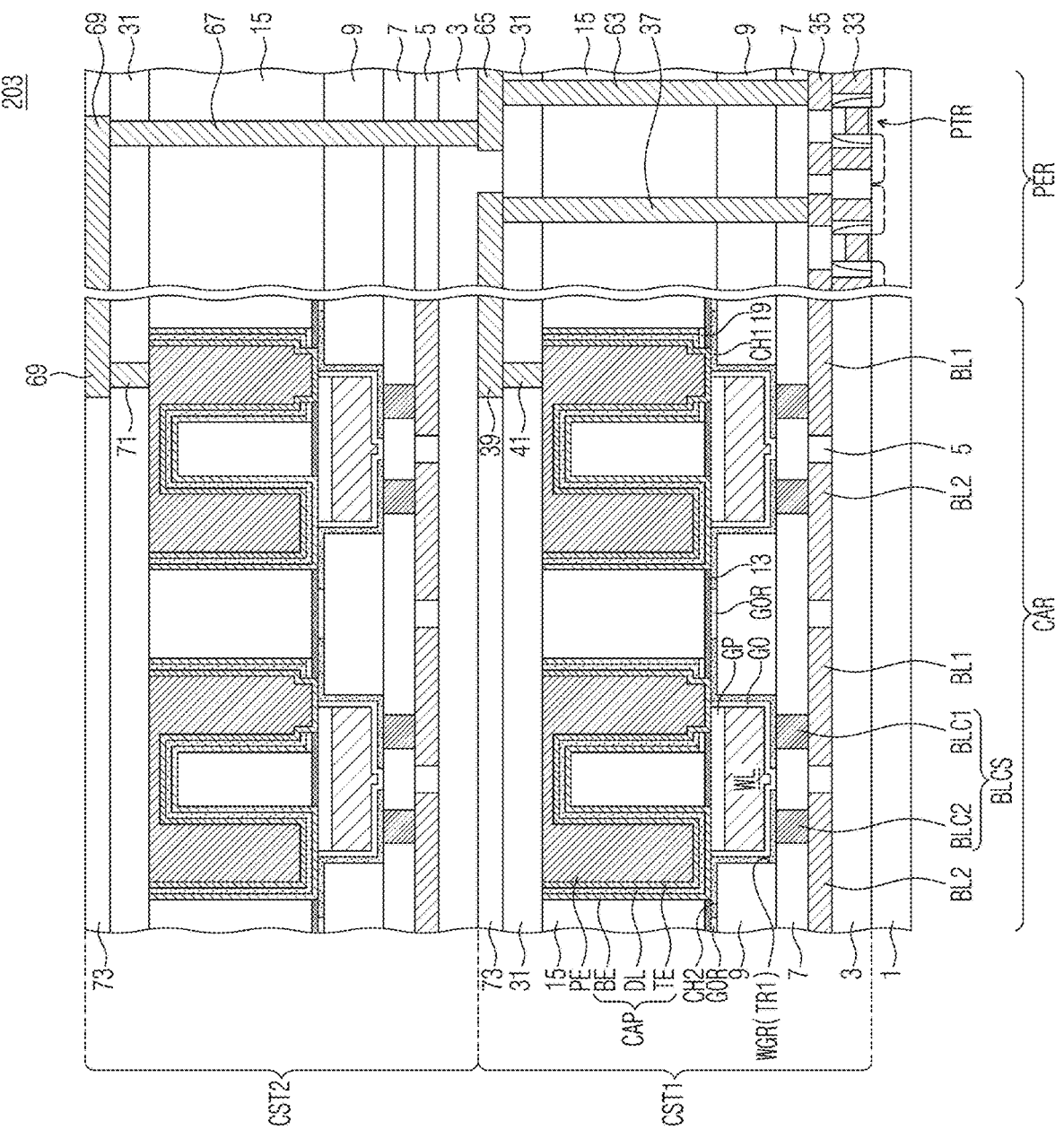
FIG. 30 is a sectional view illustrating a semiconductor memory device according to an embodiment of inventive concepts.

FIG. 30 is a sectional view illustrating a semiconductor memory device according to an embodiment of inventive concepts.

Referring to FIG. 30, in a semiconductor memory device 203 according to the present embodiment, the substrate 1 may include the cell array region CAR and the peripheral circuit region PER. A plurality of cell array structures CST1 and CST2 may be stacked on the cell array region CAR. For example, a first cell array structure CST1 and a second cell array structure CST2 may be sequentially formed on the cell array region CAR of the substrate 1. Each of the first and second cell array structures CST1 and CST2 may include a plurality of memory cells MC. Each of the first and second cell array structures CST1 and CST2 may further include a seventh interlayer insulating layer 73 on the sixth interlayer insulating layer 31. Each of the gapfill electrode patterns PE of the first cell array structure CST1 may be connected to a corresponding one of the peripheral transistors PTR through the first cell contact 41, the first peripheral interconnection line 39, and the second peripheral contact 37. Each of the gapfill electrode patterns PE of the second cell array structure CST2 may also be connected to a corresponding one of the peripheral transistors PTR through a second cell contact 71, a second peripheral interconnection line 69, a third peripheral contact 67, a second peripheral pad 65, and a fourth peripheral contact 63. Except for the afore-described differences, the semiconductor memory device may have substantially the same or similar structural features as those in the previous embodiments.

According to an embodiment of inventive concepts, a semiconductor memory device may be provided to have a 2T-1C structure having two transistors and one capacitor. In this case, it may be possible to improve a sensing margin and a noise property of the semiconductor memory device and thereby to improve reliability of the semiconductor memory device.

In a method of fabricating a semiconductor memory device according to an embodiment of inventive concepts, two transistors may be provided to share one word line, and thus, the fabrication process can be simple. Furthermore, since the capacitor is provided to have a bent structure, it may be possible to reduce the difficulty in the fabrication process. Accordingly, it may be possible to simplify the fabrication process and to increase yield in the fabrication process.

While example embodiments of inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
   a first bit line and a second bit line extending in a first direction and spaced apart from each other in a second direction;
   an interlayer insulating layer covering the first bit line and the second bit line, the interlayer insulating layer including a groove, the groove extending in the second direction and crossing both of the first bit line and the second bit line, and the groove having a U-shape;
   a first channel pattern connected to the first bit line, the first channel pattern in contact with an inner side surface of the groove, and the first channel pattern covering a portion of a top surface of the interlayer insulating layer;
   a second channel pattern connected to the second bit line, the second channel pattern in contact with an opposite inner side surface of the groove, and the second channel pattern covering an other portion of the top surface of the interlayer insulating layer;
   a word line in the groove;
   a first electrode on the interlayer insulating layer and in contact with the first channel pattern;
   a second electrode on the interlayer insulating layer and in contact with the second channel pattern; and
   a dielectric layer between the first electrode and the second electrode.

2. The semiconductor memory device of claim 1, further comprising:
  a first bit line contact between the first channel pattern and the first bit line, the first bit line contact connecting the first channel pattern and the first bit line to each other; and
  a second bit line contact between the second channel pattern and the second bit line, the second bit line contact connecting them to each other.

3. The semiconductor memory device of claim 1, wherein the first channel pattern and the second channel pattern each comprise a first pattern portion overlapping the word line from below the word line, a second pattern portion adjacent to a side surface of the word line, and a third pattern portion on the interlayer insulating layer, and
  the first channel pattern and the second channel pattern have mirror symmetric shapes with respect to the word line.

4. The semiconductor memory device of claim 3, wherein the first pattern portion and the third pattern portion are horizontally offset from each other.

5. The semiconductor memory device of claim 1, wherein a bottom surface of the word line has an uneven structure.

6. The semiconductor memory device of claim 1, wherein
  the first electrode extends to a region on the second channel pattern,
  the second electrode extends to a region on the first channel pattern,
  a bottom end of the second electrode on the first channel pattern is higher than a bottom end of the first electrode on the first channel pattern, and
  a bottom end of the first electrode on the second channel pattern is higher than a bottom end of the second electrode on the second channel pattern.

7. The semiconductor memory device of claim 1, wherein a bottom surface of the first electrode has a bent shape.

8. The semiconductor memory device of claim 1, wherein
  the first electrode comprises a first electrode portion and a second electrode portion,
  the first electrode portion contacts the first channel pattern,
  the second electrode portion extends vertically and upward from an end of the first electrode portion, and
  the second electrode portion overlaps the word line.

9. The semiconductor memory device of claim 1, wherein the first channel pattern and the second channel pattern overlap the first bit line and the second bit line, respectively.

10. A semiconductor memory device, comprising:
  a first bit line and a second bit line extending in a first direction and spaced apart from each other in a second direction;
  a word line extending in the second direction on the first bit line and the second bit line;
  a capacitor on the word line, the capacitor including a first electrode, a second electrode, and a dielectric layer between the first electrode and the second electrode;
  a first channel pattern connecting the first bit line to the first electrode, the first channel pattern disposed adjacent to a side surface of the word line; and
  a second channel pattern connecting the second bit line to the second electrode, the second channel pattern disposed adjacent to an opposite side surface of the word line,
  the first channel pattern and the second channel pattern each including a first pattern portion overlapping the word line from below the word line, a second pattern portion adjacent to one of the side surface of the word line or the opposite side surface of the word line, and a third pattern portion extending from the second pattern portion, and
  the third pattern portion being horizontally offset from the first pattern portion,
  wherein a portion of the first channel pattern is between the word line and the first bit line, and a portion of the second channel pattern is between the word line and the second bit line.

11. The semiconductor memory device of claim 10, further comprising:
  a first bit line contact between the first channel pattern and the first bit line and connecting the first channel pattern and the first bit line to each other; and
  a second bit line contact between the second channel pattern and the second bit line and connecting the second channel pattern and the second bit line to each other.

12. The semiconductor memory device of claim 10, wherein the first channel pattern and the second channel pattern have mirror symmetric shapes with respect to the word line.

13. The semiconductor memory device of claim 10, wherein a bottom surface of the word line has an uneven structure.

14. The semiconductor memory device of claim 10, wherein
  the first electrode extends to a region on the second channel pattern,
  the second electrode extends to a region on the first channel pattern,
  a bottom end of the second electrode on the first channel pattern is higher than a bottom end of the first electrode on the first channel pattern, and
  a bottom end of the first electrode on the second channel pattern is higher than a bottom end of the second electrode on the second channel pattern.

15. The semiconductor memory device of claim 10, wherein a bottom surface of the first electrode has a bent shape.

16. The semiconductor memory device of claim 10, wherein
  the first electrode comprises a first electrode portion and a second electrode portion,
  the first electrode portion contacts the first channel pattern,
  the second electrode portion extends vertically and upward from an end of the first electrode portion, and
  the second electrode portion overlaps the word line.

17. A semiconductor memory device, comprising:
  a first bit line and a second bit line extending in a first direction and spaced apart from each other in a second direction;
  an interlayer insulating layer covering the first bit line and the second bit line, the interlayer insulating layer including a groove, the groove extending in the second direction and crossing both the first bit line and the second bit line;
  a first channel pattern connected to the first bit line, the first channel pattern in contact with a first inner side surface of the groove and covering a portion of a top surface of the interlayer insulating layer;
  a second channel pattern connected to the second bit line, the second channel pattern in contact with a second inner side surface of the groove, and the second channel pattern covering an other portion of the top surface of the interlayer insulating layer;

a first bit line contact between the first channel pattern and the first bit line and connecting the first channel pattern and the first bit line to each other;

a second bit line contact between the second channel pattern and the second bit line and connecting the second channel pattern and the second bit line to each other;

a word line in the groove;

a gate insulating layer between the word line and the first channel pattern and between the word line and the second channel pattern;

a word line capping layer covering the word line;

a first electrode on the interlayer insulating layer and in contact with the first channel pattern;

a second electrode on the interlayer insulating layer and in contact with the second channel pattern; and a dielectric layer between the first electrode and the second electrode, the first channel pattern and the second channel pattern overlapping the first bit line and the second bit line, respectively.

18. The semiconductor memory device of claim 17, wherein a bottom surface of the word line has an uneven structure.

19. The semiconductor memory device of claim 17, wherein the first electrode extends to a region on the second channel pattern, the second electrode extends to a region on the first channel pattern, a bottom end of the second electrode on the first channel pattern is higher than a bottom end of the first electrode on the first channel pattern, and a bottom end of the first electrode on the second channel pattern is higher than a bottom end of the second electrode on the second channel pattern.

20. The semiconductor memory device of claim 17, wherein the first electrode comprises a first electrode portion and a second electrode portion, the first electrode portion contacts the first channel pattern, the second electrode portion extends vertically and upward from an end of the first electrode portion, and the second electrode portion overlaps the word line.

\* \* \* \* \*